(12) United States Patent
Chung et al.

(10) Patent No.: US 9,418,942 B2
(45) Date of Patent: Aug. 16, 2016

(54) SEMICONDUCTOR DEVICE

(71) Applicant: Amkor Technology, Inc., Chandler, AZ (US)

(72) Inventors: Ji Young Chung, Gyeonggi-do (KR); Yoon Joo Kim, Seoul (KR); Do Hyun Na, Seoul (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 14/565,725

(22) Filed: Dec. 10, 2014

(65) Prior Publication Data

US 2015/0187717 A1 Jul. 2, 2015

(30) Foreign Application Priority Data

Dec. 10, 2013 (KR) .................. 10-2013-0153183
Jan. 2, 2014 (KR) .................. 10-2014-0000403

(51) Int. Cl.
*H01L 23/48* (2006.01)
*H01L 23/52* (2006.01)
(Continued)

(52) U.S. Cl.
CPC ............ *H01L 23/5389* (2013.01); *H01L 24/24* (2013.01); *H01L 24/82* (2013.01); *H01L 24/96* (2013.01); *H01L 25/105* (2013.01); *H01L 21/568* (2013.01); *H01L 23/552* (2013.01); *H01L 24/13* (2013.01); *H01L 24/16* (2013.01); *H01L 24/73* (2013.01); *H01L 24/83* (2013.01); *H01L 24/92* (2013.01); *H01L 2224/0401* (2013.01); *H01L 2224/04105* (2013.01); *H01L 2224/12105* (2013.01); *H01L 2224/131* (2013.01); *H01L 2224/13025* (2013.01); *H01L 2224/16227* (2013.01); *H01L 2224/16235* (2013.01); *H01L 2224/32145* (2013.01); *H01L 2224/73215* (2013.01); *H01L 2224/73217* (2013.01); *H01L 2224/8203* (2013.01);
(Continued)

(58) Field of Classification Search
None
See application file for complete search history.

(56) References Cited

U.S. PATENT DOCUMENTS 7,176,506 B2 * 2/2007 Beroz .................. H01F 17/0033
257/232
7,825,504 B2 * 11/2010 Kim .................... H01L 23/3128
257/686
(Continued)

FOREIGN PATENT DOCUMENTS

KR   10-2001-0093048   10/2001
KR   10-2005-0073074   7/2005
(Continued)

OTHER PUBLICATIONS

Office Action received from Korean Patent Office in Korean; English Translation Not Available; Date: Feb. 14, 2015; 5 pages.
(Continued)

*Primary Examiner* — Hoang-Quan Ho
(74) *Attorney, Agent, or Firm* — Kevin B. Jackson

(57) ABSTRACT

In one embodiment, a semiconductor package includes a first semiconductor die having a first surface facing upwardly to expose a bond pad, a second semiconductor die having a first surface facing downwardly to expose a bond pad and disposed to be offset with the first surface of the first semiconductor die, and an encapsulant encapsulating the first semiconductor die and the second semiconductor die together. Throughholes are disposed in the encapsulant adjacent the bond pad of the first semiconductor die and adjacent the bond pad of the second semiconductor die.

20 Claims, 22 Drawing Sheets

(51) Int. Cl.
  *H01L 29/40* (2006.01)
  *H01L 23/12* (2006.01)
  *H01L 23/053* (2006.01)
  *H01L 23/34* (2006.01)
  *H01L 23/28* (2006.01)
  *H01L 23/538* (2006.01)
  *H01L 23/00* (2006.01)
  *H01L 25/10* (2006.01)
  *H01L 21/56* (2006.01)
  *H01L 23/552* (2006.01)

(52) U.S. Cl.
  CPC ........ *H01L 2224/83005* (2013.01); *H01L 2224/92144* (2013.01); *H01L 2225/1023* (2013.01); *H01L 2225/1058* (2013.01); *H01L 2225/1076* (2013.01); *H01L 2924/12042* (2013.01); *H01L 2924/15311* (2013.01); *H01L 2924/15331* (2013.01); *H01L 2924/1815* (2013.01); *H01L 2924/18161* (2013.01); *H01L 2924/18162* (2013.01)

(56) References Cited

U.S. PATENT DOCUMENTS

| | | | | |
|---|---|---|---|---|
| 8,273,604 | B2 * | 9/2012 | Kim | H01L 24/97 438/113 |
| 8,524,532 | B1 * | 9/2013 | Joshi | H01L 27/088 257/E21.499 |
| 8,895,440 | B2 * | 11/2014 | Choi | H01L 21/561 438/113 |
| 8,896,109 | B2 * | 11/2014 | Pagaila | H01L 25/16 257/678 |
| 2004/0021230 | A1 * | 2/2004 | Tsai | H01L 24/73 257/777 |
| 2004/0124520 | A1 * | 7/2004 | Rinne | H01L 24/13 257/686 |
| 2007/0026573 | A1 | 2/2007 | Ismail et al. | |
| 2008/0029868 | A1 * | 2/2008 | Lee | H01L 21/568 257/686 |
| 2008/0079130 | A1 * | 4/2008 | Ha | H01L 21/6835 257/680 |
| 2008/0128879 | A1 * | 6/2008 | Takiar | H01L 24/85 257/686 |
| 2009/0001542 | A1 * | 1/2009 | Kim | H01L 23/3128 257/686 |
| 2009/0057864 | A1 | 3/2009 | Choi et al. | |
| 2010/0072602 | A1 * | 3/2010 | Sutardja | H01L 23/13 257/686 |
| 2010/0193930 | A1 * | 8/2010 | Lee | H01L 23/49816 257/686 |
| 2010/0289131 | A1 * | 11/2010 | Bathan | H01L 21/768 257/686 |
| 2012/0056316 | A1 * | 3/2012 | Pagaila | H01L 25/16 257/737 |
| 2012/0211892 | A1 * | 8/2012 | Kim | H01L 24/97 257/774 |
| 2013/0069221 | A1 * | 3/2013 | Lee | H01L 23/49811 257/737 |
| 2013/0075903 | A1 * | 3/2013 | Pagaila | H01L 25/16 257/737 |
| 2013/0221442 | A1 * | 8/2013 | Joshi | H01L 27/088 257/368 |
| 2015/0028474 | A1 * | 1/2015 | Jang | H01L 23/3128 257/737 |

FOREIGN PATENT DOCUMENTS

| | | |
|---|---|---|
| KR | 10-2007-0015014 | 2/2007 |
| KR | 10-2009-055316 | 6/2009 |
| TW | 200711100 | 3/2007 |

OTHER PUBLICATIONS

Office Action From Taiwan Patent Office (TIPO) dated Nov. 23, 2015 including Search Report in Chinese (7 pages).
Non-certified English translational of TIPO Office Action dated Nov. 23, 2015 including Search Report (6 pages).

* cited by examiner

SEMICONDUCTOR DEVICE

CROSS-REFERENCE TO RELATED APPLICATIONS

This application claims priority from Korean Patent Application No. 10-2013-0153183 filed on Dec. 10, 2013 and Korean Patent Application No. 10-2014-0000403 filed on Jan. 2, 2014 in the Korean Intellectual Property Office, and all the benefits accruing therefrom under 35 U.S.C. 119, the contents of which in their entirety are herein incorporated by reference.

BACKGROUND

The present invention relates, in general, to electronics, and more particularly, to semiconductors, structures thereof, and methods of forming semiconductor devices.

As electronic products are becoming smaller in size and are required to be highly functional, a variety of techniques of providing high capacity semiconductor modules have been researched and developed. One of the techniques of providing high capacity semiconductor modules has been to increase capacity of a memory chip, that is, to achieve high integration of memory chips or memory devices. The high integration of memory devices can be achieved by packing as many cells as possible into a limited semiconductor chip space. However, the high integration of memory devices in this way has required high accuracy in fine line widths, consequently requiring highly sophisticated techniques and taking a great deal of time to develop.

Accordingly, it is desired to have an alternative structure and method for providing high capacity semiconductor modules.

Figure 1:
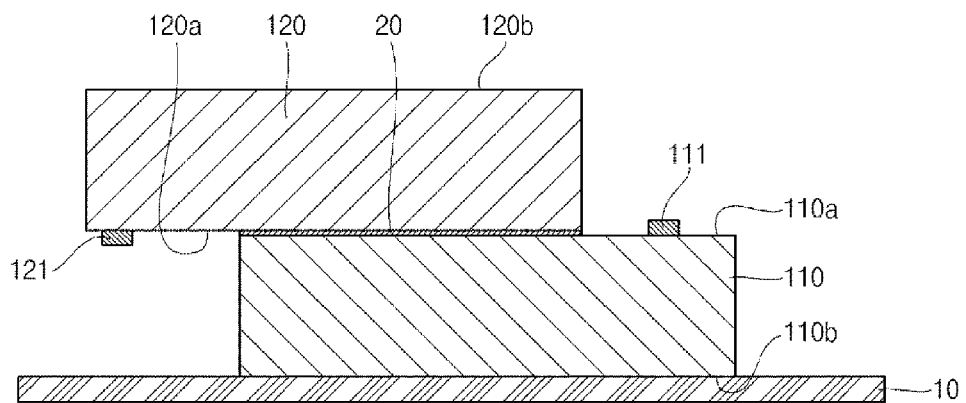
FIGS. 1 to 9 are partial sectional views sequentially illustrating a method of manufacturing a semiconductor package according to an embodiment of the present invention.

For simplicity and clarity of illustration, elements in the figures are not necessarily drawn to scale, and the same reference numbers in different figures denote generally the same elements. Additionally, descriptions and details of well-known steps and elements are omitted for simplicity of the description. It will be appreciated by those skilled in the art that words, during, while, and when as used herein related to circuit operation are not exact terms that mean an action takes place instantly upon an initiating action but that there may be some small but reasonable delay, such as propagation delay, between the reaction that is initiated by the initial action. Additionally, the term while means a certain action occurs at least within some portion of a duration of the initiating action. The use of word approximately or substantially means a value of an element is expected to be close to a state value or position. However, as is well known in the art there are always minor variances preventing values or positions from being exactly stated. As used herein, the singular forms are intended to include the plural forms as well, unless the context clearly indicates otherwise. It will be understood that, although the terms first, second, etc. may be used herein to describe various members, elements, regions, layers and/or parts, these members, elements, regions, layers and/or parts are not be limited by these terms. These terms are only used to distinguish one member, element, region, layer and/or part from another member, element, region, layer and/or part. Thus, for example, a first member, element, region, layer and/or part discussed below could be termed a second member, element, region, layer and/or part without departing from the teachings of the present invention.

DETAILED DESCRIPTION OF THE DRAWINGS

The present description includes, among other features, a semiconductor package that can be manufactured in a small size. The present description also includes, among other features, a semiconductor package, which can obviate the need to provide a printed circuit board (PCB).

In one embodiment, a semiconductor package includes a first semiconductor die having a first surface facing upwardly to expose a bond pad. A second semiconductor die having a first surface facing downwardly to expose a bond pad and is disposed to alternate with or to be offset with respect to the first surface of the first semiconductor die. An encapsulant encapsulating the first semiconductor die and the second semiconductor die together, wherein throughholes are disposed in the encapsulant adjacent the bond pad of the first semiconductor die and adjacent the bond pad of the second semiconductor die.

In another embodiment, a semiconductor package includes a first semiconductor die having a first surface facing upwardly to expose a bond pad. A second semiconductor die having a first surface facing downwardly to expose a bond pad and is disposed to alternate with or to be laterally offset and partially overlapping the first surface of the first semiconductor die. An encapsulant encapsulating the first semiconductor die and the second semiconductor die together, wherein the first semiconductor die and the second semiconductor die are electrically connected to the bond pads, respectively, and include wires exposed to an outer surface of the encapsulant.

In a further embodiment, a semiconductor package includes a plurality of semiconductor dies each including a conductive pad formed on its one surface and a conductive bump connected to the conductive pad and stacked to have non-overlapping regions at portions where the conductive pads are formed, and first encapsulant portions disposed on the non-overlapping regions, respectively, and a plurality of first solder balls connected to the conductive bumps and positioned on the same layer.

Hereinafter, a method of manufacturing a semiconductor package 100, 100' according to an embodiment and a semiconductor package using the method will be described with reference to FIGS. 1 to 9.

FIGS. 1 to 9 are partial sectional views sequentially illustrating a method of manufacturing a semiconductor package according to a first embodiment. First, as illustrated in FIG. 1, a first semiconductor die 110 and a second semiconductor die 120 are sequentially stacked on a carrier 10. In one embodiment, the first semiconductor die 110 has a first surface 110a to expose a bond pad 111 electrically connected to an active layer (not shown), and the first surface 110a of the first semiconductor die 110 is mounted on the carrier 10 to face outwardly. That is, the first semiconductor die 110 is mounted on the carrier 10 such that a second surface 110b of the first semiconductor die 110 faces a top surface of the carrier 10.

In one embodiment, the bond pad 111 can be formed of a material selected from the group consisting of an aluminum pad, a solder including tin-lead (Sn—Pb), tin-lead-silver (Sn—Pb—Ag), tin-lead-bismuth (Sn—Pb—Bi, tin-copper (Sn—Cu), tin-silver (Sn—Ag), tin-bismuth (Sn—Bi), tin-copper-silver (Sn—Ag—Cu), tin-silver-bismuth (Sn—Ag—Bi) or tin-zinc (Sn—Zn) and equivalents thereof, but aspects of the present embodiment are not limited thereto.

Thereafter, the second semiconductor die 120 is alternately mounted on the first semiconductor die 110 (i.e., second semiconductor die 120 is laterally offset and partially overlaps semiconductor die 110). In one embodiment, the second semiconductor die 120 has the same configuration as the first semiconductor die 110 and is rotated 180 degrees to then be mounted on the first semiconductor die 110. In one embodiment, the second semiconductor die 120 has a first surface 120a to expose a bond pad 121 electrically connected to an active layer (not shown), and is mounted on the first surface 110a of the first semiconductor die 110 such that the first surface 120a of the second semiconductor die 120 faces downwardly. That is, the second semiconductor die 120 is mounted on the first semiconductor die 110 such that the first surface 120a of the second semiconductor die 120 faces the first surface 110a of the first semiconductor die 110. Here, since the first semiconductor die 110 and the second semiconductor die 120 are alternately arranged and not in alignment with each other in the vertical direction, the bond pads 111 and 121 do not overlap with each other.

In one embodiment, an adhesion member 20 can be disposed between the first surface 120a of the second semiconductor die 120 and the first surface 110a of the first semiconductor die 110. The adhesion member 20 may include one or more materials selected from a general liquid-type epoxy adhesive, an adhesive film, an adhesive tape, and equivalents thereof, but aspects of the present embodiment are not limited thereto. In one embodiment, the bond pad 121 has the same configuration with the bond pad 111 and a detailed description thereof will not be provided.

Figure 2:
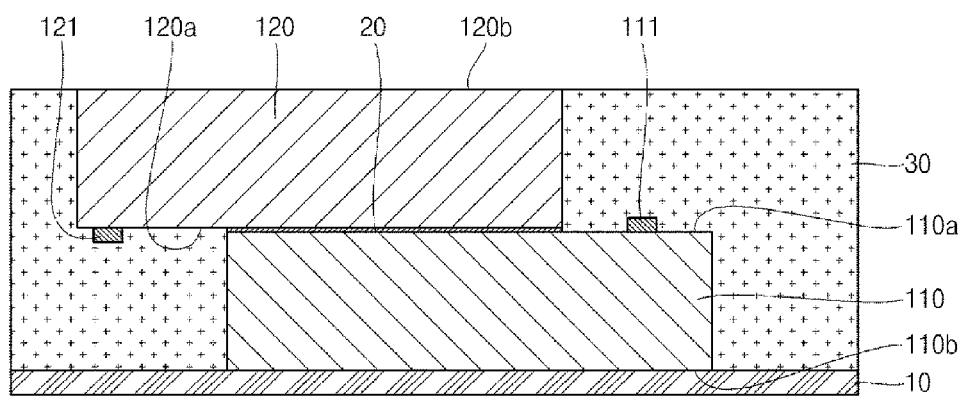

Referring to FIG. 2, the first semiconductor die 110 and the second semiconductor die 120 are encapsulated together on the carrier 10 using an encapsulant 30. In one embodiment, the encapsulant 30 completely encapsulates the first semiconductor die 110 and the second semiconductor die 120 to protect them from, for example, external shocks and damage due to oxidation. In one embodiment, the encapsulant 30 can include one selected from an epoxy compound performing encapsulation using a mold, a liquid-type encapsulant performing encapsulation using a dispenser and an equivalent thereof, but aspects of the present embodiment are not limited thereto.

Figure 3:
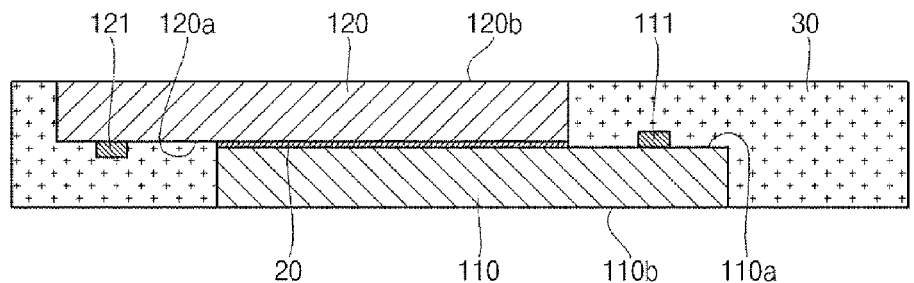

Referring to FIG. 3, the carrier 10 is removed, and unnecessary portions of the second surface 110b of the first semiconductor die 110 and the second surface 120b of the second semiconductor die 120 can be removed through a grinding process by a predetermined thickness. In one embodiment, the grinding process can be performed by using, for example, a diamond grinder or an equivalent thereof, but aspects of the present embodiment are not limited thereto.

Figure 4:
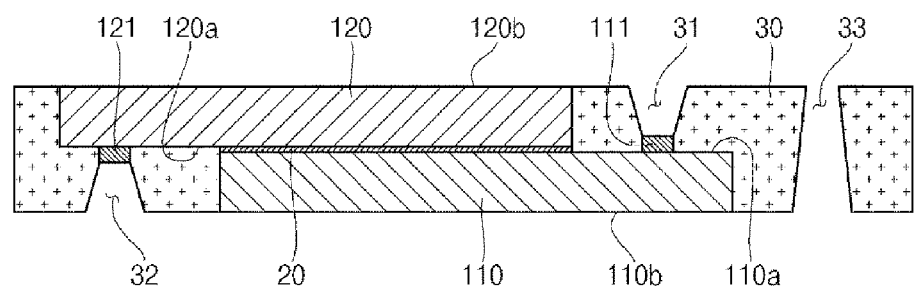

Referring to FIG. 4, throughholes 31, 32 and 33 are formed in the encapsulant 30 to expose the bond pad 111 of the first semiconductor die 110 and the bond pad 121 of the second semiconductor die 120 to the outside. In one embodiment, the throughholes 31, 32 and 33 can be formed by laser drilling or chemical etching, but aspects of the present embodiment are not limited thereto.

In one embodiment, the throughholes 31, 32 and 33 can include a first throughhole 31, a second throughhole 32 and a third throughhole 33. The first throughhole 31 can be formed at a position corresponding to the bond pad 111 of the first semiconductor die 110 and can be formed to penetrate from a top surface of the encapsulant 30 to a depth at which the bond pad 111 is exposed to the outside. The second throughhole 32 can be formed at a position corresponding to the bond pad 121 of the second semiconductor die 120 and can be formed to penetrate from a bottom surface of the encapsulant 30 to a depth in which the bond pad 121 is exposed to the outside. The third throughhole 33 can be formed at a position adjacent to the bond pad 111 of the first semiconductor die 110 and can be formed to penetrate from the top surface to the bottom surface of the encapsulant 30 or completely through the encapsulant 30 as generally illustrated in FIG. 4.

Figure 5:
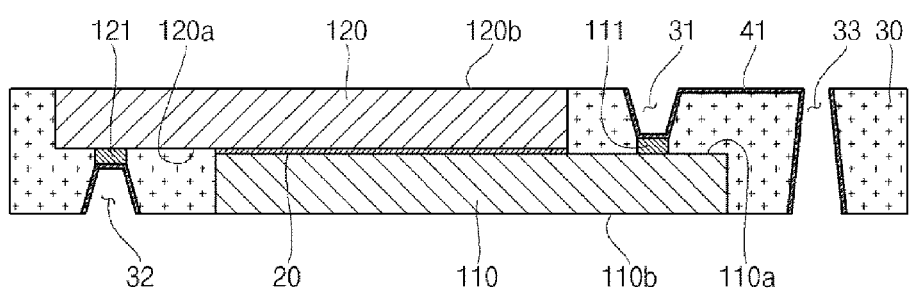

Next, referring to FIG. 5, first conductive layers 41 are formed along inner surfaces of the throughholes 31, 32 and 33. In one embodiment, the first conductive layers 41 also can be formed in regions where the bond pads 111 and 121 are exposed. In one embodiment, the first conductive layer 41 is configured as a seed layer for forming a second conductive layer 42 to be described later. More particularly, the first conductive layer 41 can be formed by sequentially depositing titanium and copper or by sequentially depositing a titanium-tungsten alloy and copper, but aspects of the present embodiment are not limited thereto.

In one embodiment, in order to electrically connect the first conductive layer 41 formed in the first throughhole 31 to the first conductive layer 41 formed in the third throughhole 33, the first conductive layer 41 can be formed in a region between the first throughhole 31 and the third throughhole 33 on or overlapping the top or major surface of the encapsulant 30. Accordingly, the bond pad 111 of the first semiconductor die 110 may generate signal paths downwardly through the first conductive layer 41 formed in the first throughhole 31, the third throughhole 33 and the region between the first throughhole 31 and the third throughhole 33.

Figure 6:
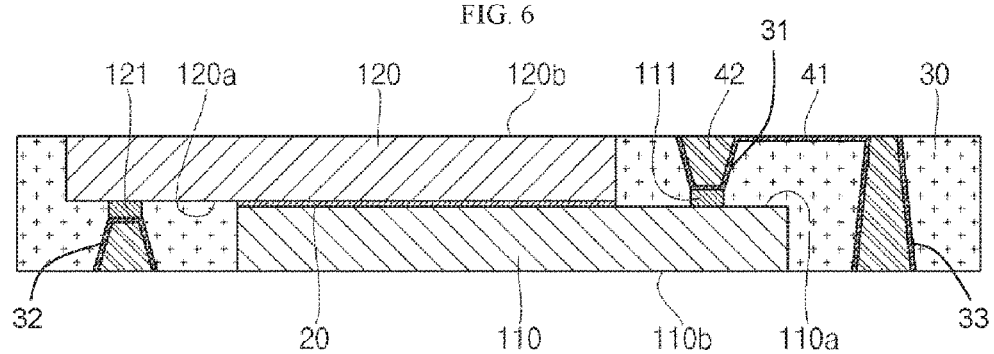

Referring to FIG. 6, the second conductive layer 42 is formed to fill the throughholes 31, 32 and 33. In one embodiment, the second conductive layer 42 is preferably formed by electroplating a copper layer on the first conductive layer 41. In this embodiment, when the second conductive layer 42 is formed by electroplating, the first conductive layer 41 is configured to provide a path for the flow of current, thereby forming the second conductive layer 42 on the first conductive layer 41, but aspects of the present embodiment are not limited thereto.

Although not shown, in another embodiment a solder ball 50 (to be described in conjunction with FIG. 7) can be directly attached to the first conductive layer 41 without the second conductive layer 42. In this embodiment, some of the solder ball 50 may directly fill the second throughhole 32 and the third throughhole 33.

Figure 7:
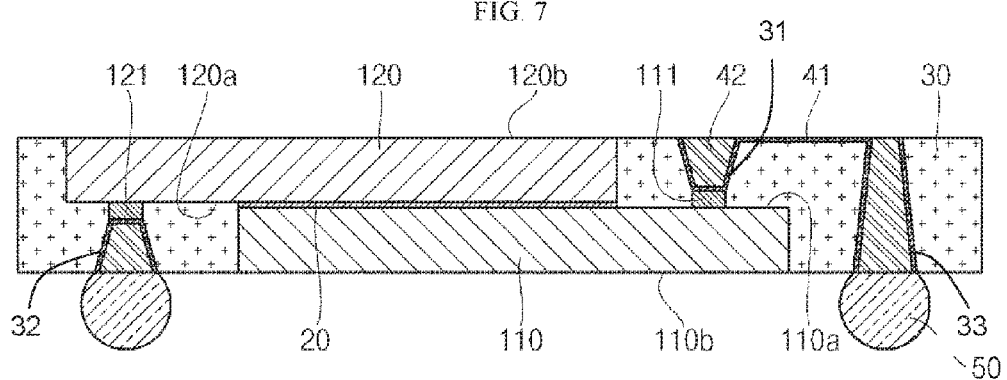

Next, referring to FIG. 7, in one embodiment the solder ball 50 is attached to a lower side of each of the second throughhole 32 and the third throughhole 33. In one embodiment, the solder ball 50 can be formed using one metal selected from lead/tin (Pb/Sn) or leadless tin (Leadless Sn) or other equivalent materials as known to those of ordinary skill in the art, but aspects of the present embodiment are not limited thereto.

Figure 8:
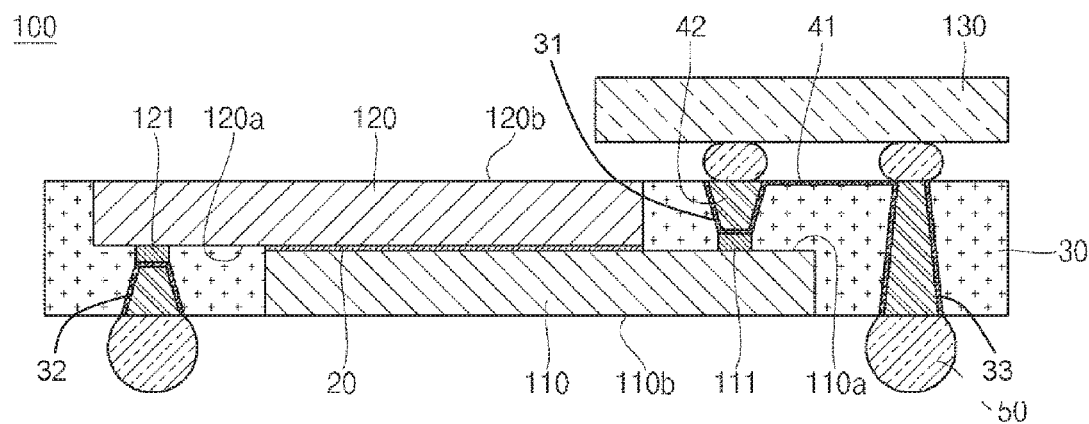

Referring to FIG. 8, a semiconductor package 100 is formed by stacking a third semiconductor die 130 on the encapsulant 30. In one embodiment, the third semiconductor die 130 is electrically connected to the solder ball 50 through the throughholes 31, 32 and 33. In one embodiment, the first conductive layer 41 formed in the region between the first throughhole 31 and the third throughhole 33 may be removed for preventing a short circuit.

Figure 9:
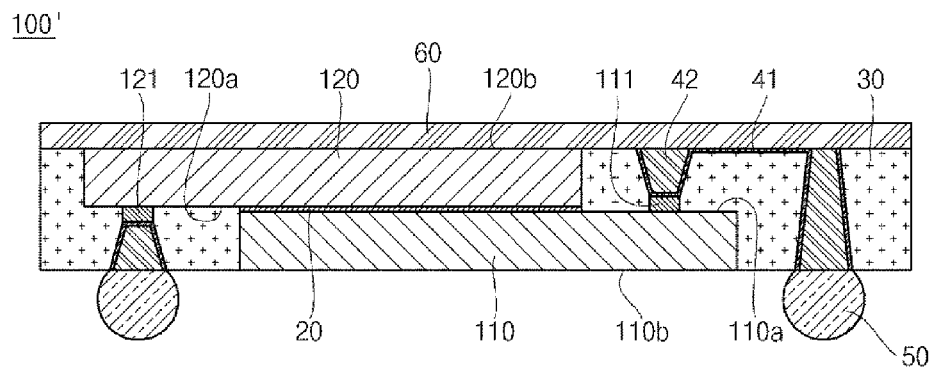

Referring to FIG. 9, a semiconductor package 100' is formed by attaching a protective film 60 on the encapsulant 30. The protective film 60 is configured to protect the second surface 120b of the second semiconductor die 120, exposed by the grinding process, the first conductive layer 41, and the second conductive layer 42 from the external environment.

Next, a method of manufacturing a semiconductor package 200 according to another embodiment of the present invention and a semiconductor package using the method will be described with reference to FIGS. 10 to 13. FIGS. 10 to 13 are partial sectional views sequentially illustrating a method of manufacturing a semiconductor package according to another embodiment.

Figure 10:
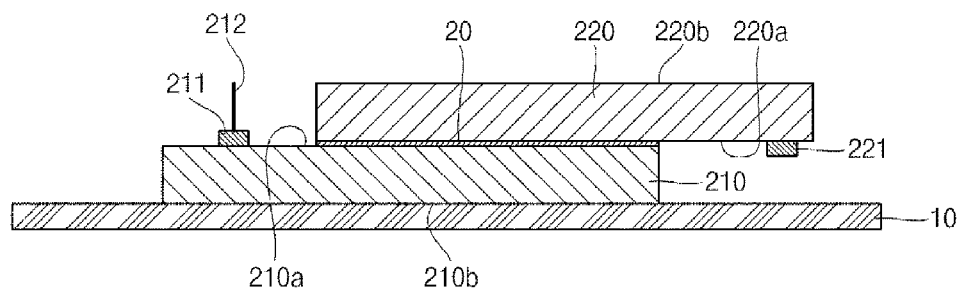
FIGS. 10 to 13 are partial sectional views sequentially illustrating a method of manufacturing a semiconductor package according to another embodiment of the present invention.

First, as illustrated in FIG. 10, a first semiconductor die 210 and a second semiconductor die 220 are sequentially stacked on a carrier 10. In one embodiment, the first semiconductor die 210 has a first surface 210a to expose a bond pad 211 electrically connected to an active layer (not shown), and the first surface 210a of the first semiconductor die 210 is mounted on the carrier 10 to face upwardly. That is, the second semiconductor die 220 is mounted on the carrier 10 such that a second surface 210b of the first semiconductor die 210 faces a top surface of the carrier 10.

In one embodiment, the bond pad 211 can be formed of one selected from the group consisting of an aluminum pad, a solder including tin-lead (Sn—Pb), tin-lead-silver (Sn—Pb—Ag), tin-lead-bismuth (Sn—Pb—Bi, tin-copper (Sn—Cu), tin-silver (Sn—Ag), tin-bismuth (Sn—Bi), tin-copper-silver (Sn—Ag—Cu), tin-silver-bismuth (Sn—Ag—Bi) or tin-zinc (Sn—Zn) and equivalents thereof, but aspects of the present embodiment are not limited thereto.

Thereafter, the second semiconductor die 220 is alternately mounted (i.e., a portion of the second semiconductor die 220 overhangs an edge of the first semiconductor die 210) on the first semiconductor die 210. The second semiconductor die 220 has the same configuration with the first semiconductor die 210 and is rotated 180 degrees to then be mounted on the first semiconductor die 210. In one embodiment, the second semiconductor die 220 has a first surface 220a to expose a bond pad 221 electrically connected to an active layer (not shown) and is mounted on the first surface 210a of the first semiconductor die 210 such that the first surface 220a of the second semiconductor die 220 faces downwardly. That is, the second semiconductor die 220 is mounted on the first semiconductor die 210 such that such that the first surface 220a of the second semiconductor die 220 faces the first surface 210a of the first semiconductor die 210. Here, since the first semiconductor die 210 and the second semiconductor die 220 are alternately arranged and not in alignment with each other in the vertical direction, the bond pads 211 and 221 do not overlap with each other.

In one embodiment, an adhesion member 20 can be disposed between the first surface 220a of the second semiconductor die 220 and the first surface 210a of the first semiconductor die 210. The adhesion member 20 may include one or more materials selected from a general liquid-type epoxy adhesive, an adhesive film, an adhesive tape, and equivalents thereof, but aspects of the present embodiment are not limited thereto.

Here, the bond pad 221 has the same configuration with the bond pad 211 and a detailed description thereof will not be given. In addition, in the present embodiment a wire 212 is attached to the bond pad 211 of the first semiconductor die 210 and is configured to extend upwardly away from the first surface 210a. In one embodiment, the wire 212 may have a length approximately corresponding to a height of the first semiconductor die 210.

Figure 11:
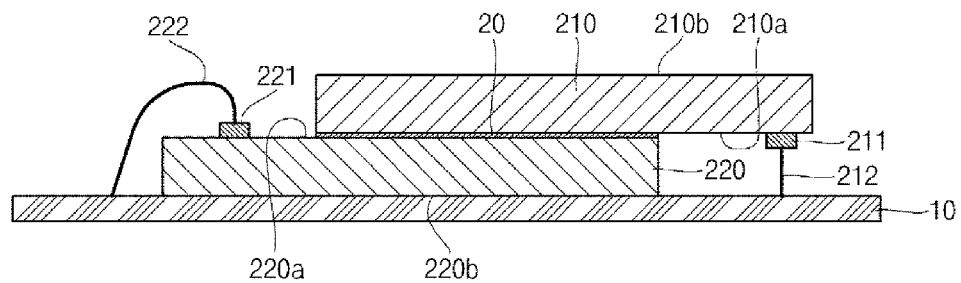

Next, referring to FIG. 11, the first semiconductor die 210 and the second semiconductor die 220 are turned over 180 degrees on the carrier 10 and a wire 222 is attached to the bond pad 221 of the second semiconductor die 220 to then extend to reach the top surface of the carrier 10.

Figure 12:
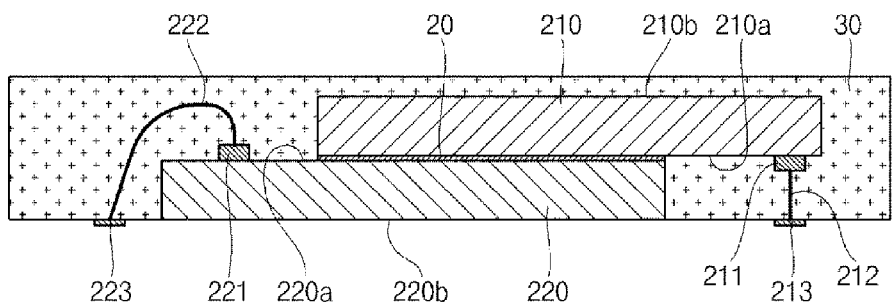

Referring to FIG. 12, the first semiconductor die 210 and the second semiconductor die 220 are encapsulated together on the carrier 10 using the encapsulant 30. In one embodiment, the encapsulant 30 completely encapsulates the first semiconductor die 210 and the second semiconductor die 220 to protect them from, for example, external shocks and damages due to oxidation. In one embodiment, the encapsulant 30 can include one selected from an epoxy compound performing encapsulation using a mold, a liquid-type encapsulant performing encapsulation using a dispenser and an equivalent thereof, but aspects of the present invention are not limited thereto.

In accordance with the present embodiment, each of the wires 212 and 222 are encapsulated by the encapsulant 30, and one end of each of the wires 212 and 222 is exposed to the bottom surface of the encapsulant 30. In one embodiment, a bump pad 223 is disposed at the exposed ends of each of the wires 212 and 222. In one embodiment, the bump pad 223 can be a conductive material, such copper and an equivalent thereof, but aspects of the present embodiment are not limited thereto.

Figure 13:
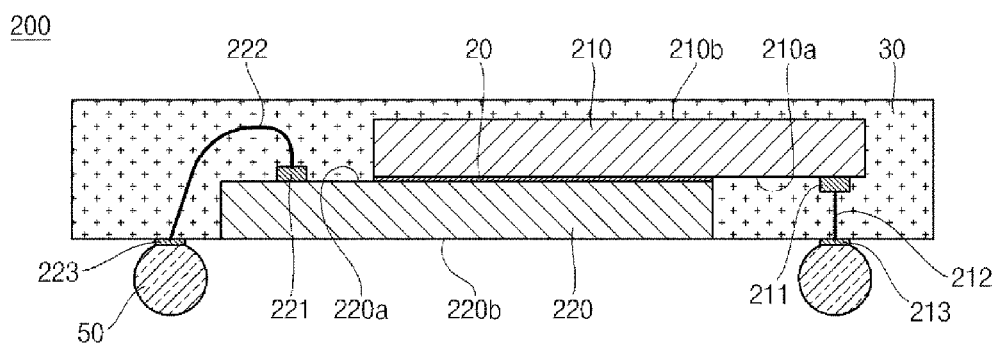

Referring to FIG. 13, in one embodiment, a solder ball 50 is attached to a lower side of the bump pad 223, thereby forming the semiconductor package 200. In one embodiment, the solder ball 50 can be one or more metals selected from lead/tin (Pb/Sn) or leadless tin (Leadless Sn) and equivalents thereof, but aspects of the present embodiment are not limited thereto.

Figure 14:
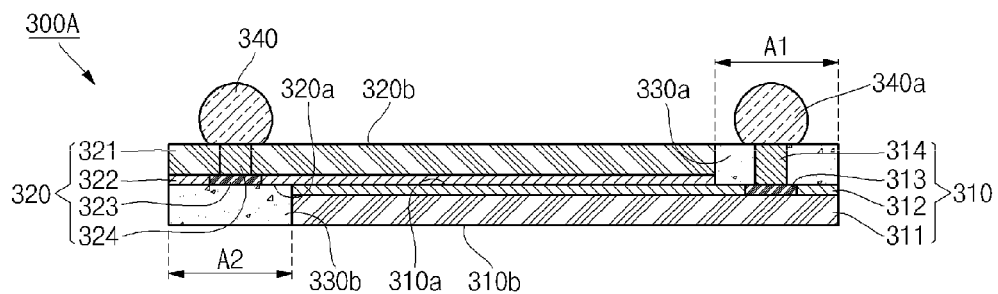
FIG. 14 is a sectional view illustrating a semiconductor device according to still another embodiment of the present invention.

FIG. 14 is a sectional view illustrating a semiconductor device 300A according to still another embodiment. Referring to FIG. 14, the semiconductor device 300A includes a plurality of semiconductor dies 310 and 320, first encapsulants 330a and 330b and a plurality of first solder balls 340a and 340b. The plurality of semiconductor dies 310 and 320 include a first semiconductor die 310 and a second semiconductor die 320.

The first semiconductor die 310 can include an inactive region 311, an active region 312, a first bond pad 313 and a first conductive bump 314. The inactive region 311 can be a general wafer. The active region 312 can be formed on the inactive region 311 and, in one embodiment, can include memory chips or memory devices. The first bond pad 313 can be one or more conductive materials, such as copper, aluminum, gold, silver, and equivalents thereof, but aspects of the present embodiment are not limited thereto. The first conductive bump 314 can be connected to the first bond pad 313 and configured to upwardly protrude from the first bond pad 313 to a predetermined height. The first conductive bump 314 can be copper or tin, but aspects of the present embodiment are not limited thereto.

The first semiconductor die 310 can have a first surface 310a and a second surface 310b opposite to each other. In one embodiment, the first surface 310a is defined as a top surface of the first semiconductor die 310, that is, a top surface of the active region 312, and the second surface 310b is defined as a bottom surface of the first semiconductor die 310, that is, a bottom surface of the inactive region 311. In one embodiment, the second semiconductor die 320 can include an inactive region 321, an active region 322, a second bond pad 323 and a second conductive bump 324. The inactive region 321 can be a general wafer. The active region 322 can be formed on the inactive region 321 and, in one embodiment, can include memory chips or memory devices. The second bond pad 323 can be one or more conductive materials, such as copper, aluminum, gold, silver, and equivalents thereof, but aspects of the present embodiment are not limited thereto. In one embodiment, the second conductive bump 324 can be connected to the second bond pad 323 and can be configured to upwardly protrude from the second bond pad 323 while passing through the inactive region 321. The second conductive bump 324 can be copper or tin, but aspects of the present embodiment are not limited thereto.

In one embodiment, the second semiconductor die 320 can have a third surface 320a and a fourth surface 320b opposite to each other. In one embodiment, the third surface 320a is defined as a bottom surface of the second semiconductor die 320, that is, a bottom surface of the active region 322, and the fourth surface 320b is defined as a top surface of the second semiconductor die 320, that is, a top surface of the inactive region 321.

In accordance with the present embodiment, the second semiconductor die 320 can be disposed on the first semiconductor die 310 such that the first surface 310a of the first semiconductor die 310 and the third surface 320a of the second semiconductor die 320 are brought into contact with each other. In accordance with the present embodiment, the first and second semiconductor dies 310 and 320 may not be disposed to completely overlap with each other but can be stacked to form non-overlapping regions A1 and A2 at opposite side portions of the first and second semiconductor dies 310 and 320, where the first and second bond pads 313 and 323 are formed. The first conductive bump 314 of the first semiconductor die 310 may be positioned in the non-overlapping regions A1 and A2 and can protrude to an imaginary horizontal line formed by the fourth surface 320b of the second semiconductor die 320.

The first encapsulants 330a and 330b can be disposed to fill the non-overlapping regions A1 and A2 of the first and second semiconductor dies 310 and 320. In accordance with the present embodiment, the first encapsulants 330a and 330b can be configured to more tightly connect the first and second semiconductor dies 310 and 320 to each other. In one embodiment, the first encapsulants 330a and 330b are configured to tightly affix the first conductive bump 314 to the first bond pad 313 in the non-overlapping region 330a of the first bond pad 313.

In one embodiment, a first solder ball 340a can be connected to an upper portion of the first conductive bump 314 and a first solder ball 340b can be connected to an upper portion of the second conductive bump 324.

Figure 15:
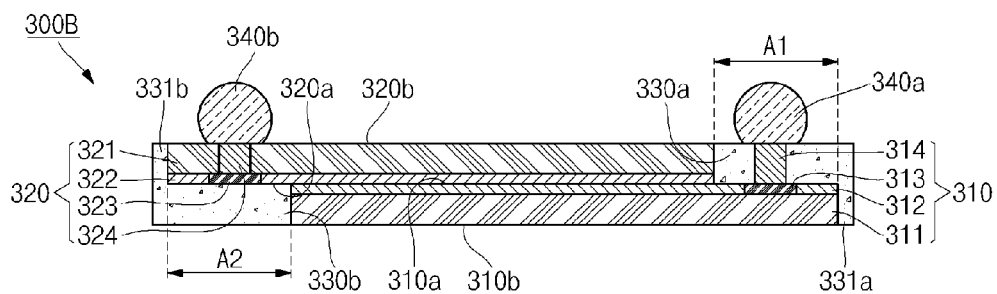
FIGS. 15 to 17 are sectional views illustrating semiconductor devices according to modified example embodiments of the present invention.
Figure 16:
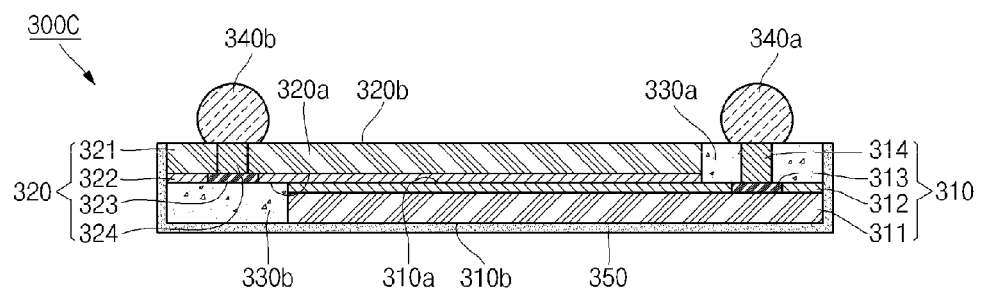
Figure 17:
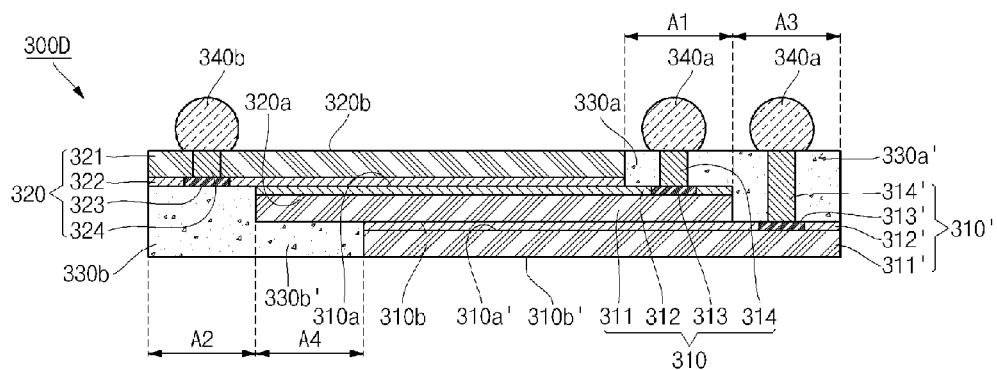

FIGS. 15, 16, and 17 are sectional views illustrating semiconductor devices 300B, 300C, and 300D respectively in accordance with alternative embodiments have similarities to semiconductor device 300A.

The semiconductor device 300B illustrated in FIG. 15 is formed by further disposing second encapsulants 331a and 331b on lateral surfaces of the semiconductor device 300A illustrated in FIG. 14. In one embodiment, the second encapsulants 331a and 331b can be integrally connected to the first encapsulants 330a and 330b, respectively. Compared with the semiconductor device 300A of FIG. 14, the semiconductor device 300B has molding regions, that is, encapsulant regions extending to lateral sides of the device such that the first and second semiconductor dies 310 and 320 are laterally spaced apart from outer edges of the second encapsulants 331a and 331b, thereby better protecting the semiconductor device 300B from external surroundings.

The semiconductor device 300C illustrated in FIG. 16 can be formed by further disposing an insulation protecting layer, such as an electromagnetic interference (EMI) protecting layer, surrounding at least the lateral surfaces and the bottom surface of the semiconductor device 300A illustrated in FIG. 14.

The semiconductor device 300D illustrated in FIG. 17 can be formed by further stacking three or more layers of semiconductor dies, and in one embodiment, can include two or more first semiconductor dies 310 and 310'. For example, an additional first semiconductor die 310' can be further disposed under the semiconductor device 300A illustrated in FIG. 14, for example, before the first encapsulants 330a and 330b are formed.

In one embodiment, the additional first semiconductor die 310' can have substantially the same configuration as the first semiconductor die 310 illustrated in FIG. 14. The additional first semiconductor die 310' can include an inactive region 311', an active region 312', an additional first bond pad 313' and an additional first conductive bump 314'. In one embodiment, the inactive region 311' can be a general wafer. The active region 312' can be formed on the inactive region 311' and, in one embodiment, can include memory chips or memory devices. The additional first bond pad 313' can be one or more conductive materials, such as copper, aluminum, gold, silver, and equivalents thereof, but aspects of the present embodiment are not limited thereto. The additional first conductive bump 314' can be connected to the additional first bond pad 313' and can be configured to upwardly protrude from the additional first bond pad 313' to a predetermined height. For example, the additional first conductive bump 314' can protrude from the additional first bond pad 313' to an imaginary horizontal line formed by the fourth surface 320*b* of the second semiconductor die 320.

The additional first conductive bump 314' can be a conductive material, such as copper or tin, but aspects of the present embodiment are not limited thereto. The additional first semiconductor die 310' can have an additional first surface 310*a*' and an additional second surface 310*b*' opposite to each other. Here, the additional first surface 310*a*' can be defined as a top surface of the additional first semiconductor die 310', that is, a top surface of the active region 312', and the additional second surface 310*b*' can be defined as a bottom surface of the additional first semiconductor die 310', that is, a bottom surface of the inactive region 311'. In one embodiment, there can be non-overlapping regions A3 and A4 disposed between the first semiconductor die 310 and the additional first semiconductor die 310', and the first semiconductor die 310 and the additional first semiconductor die 310' can be stacked such that the second surface 310*b* of the first semiconductor die 310 is brought into contact with the additional first surface 310*a* of the additional first semiconductor die 310'. Another conductive bump 314' can be positioned on the non-overlapping region A3 of the additional first bond pad 313'.

Figure 18:
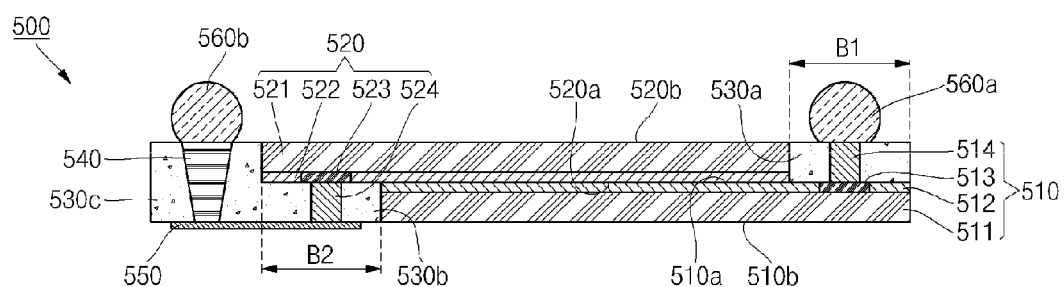
FIG. 18 is a sectional view illustrating a semiconductor device according to still another embodiment of the present invention.

FIG. 18 is a sectional view illustrating a semiconductor device 500 according to another embodiment. Referring to FIG. 18, in one embodiment the semiconductor device 500 includes a plurality of semiconductor dies 510 and 520, first encapsulants 530*a* and 530*b*, a second encapsulant 530*c*, a conductive via 540 and a plurality of solder balls 560*a* and 560*b*. In another embodiment, the semiconductor device 500 can further include a redistribution layer 550.

In one embodiment, the plurality of semiconductor dies 510 and 520 can include a first semiconductor die 510 and a second semiconductor die 520. In one embodiment, the first semiconductor die 510 can include an inactive region 511, an active region 512, a first bond pad 513 and a first conductive bump 514. In one embodiment, the inactive region 511 can be a general wafer. The active region 512 may be formed on the inactive region 511 and, in one embodiment may include memory chips or memory devices. The first bond pad 513 can be one or more conductive materials, such as copper, aluminum, gold, silver, and equivalents thereof, but aspects of the present embodiment are not limited thereto. The first conductive bump 514 can be connected to the first bond pad 513 and can be configured to upwardly protrude from the first bond pad 513 to a predetermined height. In one embodiment, the first conductive bump 514 can be copper or tin, but aspects of the present embodiment are not limited thereto.

The first semiconductor die 510 can have a first surface 510*a* and a second surface 510*b* opposite to each other. In one embodiment, the first surface 510*a* can be defined as a top surface of the first semiconductor die 510, that is, a top surface of the active region 512, and the second surface 510*b* can be defined as a bottom surface of the first semiconductor die 510, that is, a bottom surface of the inactive region 511.

In one embodiment, the second semiconductor die 520 can include an inactive region 521, an active region 522, a second bond pad 523 and a second conductive bump 524. In one embodiment, the inactive region 521 may be a general wafer. The active region 522 can be formed on the inactive region 521 and, in one embodiment, can include memory chips or memory devices. The second bond pad 523 can be one or more conductive materials, such as copper, aluminum, gold, silver, and equivalents thereof, but aspects of the present embodiment are not limited thereto. In one embodiment, the second conductive bump 524 can be connected to the second bond pad 323 and can be configured to downwardly protrude from the second bond pad 523 to the bottom surface of the first encapsulant 530*b* while passing through a first encapsulant 530*b* (to be described later) the inactive region 521. In one embodiment, the second conductive bump 524 can be copper or tin, but aspects of the present embodiment are not limited thereto.

The second semiconductor die 520 can have a third surface 520*a* and a fourth surface 520*b* opposite to each other. In one embodiment, the third surface 520*a* can be defined as a bottom surface of the second semiconductor die 520, that is, a bottom surface of the active region 522, and the fourth surface 520*b* can be defined as a top surface of the second semiconductor die 520, that is, a top surface of the inactive region 521.

In accordance with the present embodiment, the second semiconductor die 520 can be disposed on the first semiconductor die 510 such that the first surface 510*a* of the first semiconductor die 510 and the third surface 520*a* of the second semiconductor die 520 are brought into contact with each other. In accordance with the present embodiment, the first and second semiconductor dies 510 and 520 may not be disposed to completely overlap with each other but can be stacked to form non-overlapping regions B1 and B2 at opposite side portions of the first and second semiconductor dies 510 and 520, where the first and second bond pads 513 and 523 are formed. The first conductive bump 514 of the first semiconductor die 510 and the second conductive bump 524 of the second semiconductor die 520 may be positioned in the non-overlapping regions B1 and B2, respectively. The first conductive bump 514 may protrude to an imaginary horizontal line formed by the fourth surface 520*b* of the second semiconductor die 520, and the second conductive bump 524 can protrude to an imaginary horizontal line formed by the second surface 510*b* of the first semiconductor die 510.

The first encapsulants 530*a* and 530*b* can be disposed to fill the non-overlapping regions B1 and B2 of the first and second semiconductor dies 510 and 520. In accordance with the present embodiment, the first encapsulants 530*a* and 530*b* can be configured to more tightly connect the first and second semiconductor dies 510 and 520 to each other. In one embodiment, the first encapsulants 530*a* and 530*b* are configured to tightly affix the first and second conductive bumps 514 and 524 to the first and second bond pads 513 and 523 in the non-overlapping regions 530*a* and 530*b*.

In one embodiment, the second encapsulant 530*c* can be formed on lateral surfaces of the first and second semiconductor dies 510 and 520 to be connected to the first encapsulant 530*b*. For example, the second encapsulant 530*c* can be formed to be connected to the first encapsulant 530*b* formed on the non-overlapping region B2 of the second conductive bump 524. Since the first conductive bump 514 and the second conductive bump 524 protrude in different directions, electric paths of the first conductive bump 514 and the second conductive bump 524 should conform to each other. When the electrical path of the second conductive bump 524 is changed, as illustrated in FIG. 18, the second encapsulant 530*c* is preferably connected to the first encapsulant 530*b* of the second conductive bump 524.

In one embodiment, the conductive via 540 can be formed to penetrate from a top surface to a bottom surface of the second encapsulant 530*c*. In one embodiment, the top surface of the second encapsulant 530*c* can be substantially coplanar with the fourth surface 520*b* of the second semiconductor die 520, and the bottom surface of the second encapsulant 530*c* can be substantially coplanar with the second surface 510*b* of the first semiconductor die 510. In one embodiment, the conductive via 540 can be a conductive material, such as one or more metal materials, but aspects of the present embodiment are not limited thereto.

A redistribution layer 550 can be configured to electrically connect the second conductive bump 524 to the conductive via 540 and, in one embodiment, can be disposed on outer surfaces of the first and second encapsulants 530b and 530c. In one embodiment, the redistribution layer 550 can be a conductive material, such as one more metal materials, but aspects of the present embodiment are not limited thereto.

In one embodiment, the plurality of solder balls 560a and 560b can include a first solder ball 560a and a second solder ball 560b. In one embodiment, the first solder ball 560a can be connected to an upper portion of the first conductive bump 514 and the second solder ball 560b can be connected to an upper portion of the second conductive bump 524.

Figure 19:
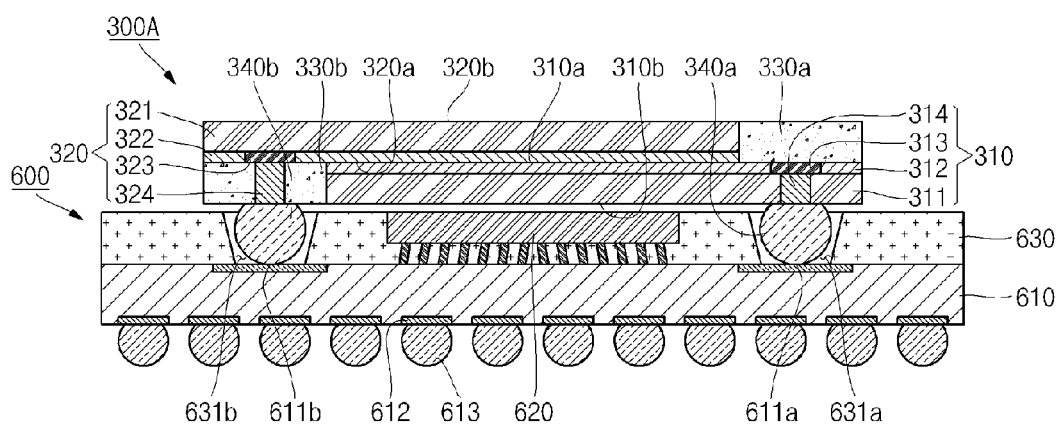
FIG. 19 is a sectional view illustrating a semiconductor package according to still another embodiment of the present invention.

FIG. 19 is a sectional view illustrating a semiconductor package according to further embodiment. The semiconductor package illustrated in FIG. 19 can include a circuit board 600 including the semiconductor device 300A illustrated in FIG. 14 and a semiconductor chip 620 electrically connected to the semiconductor device 300A. In FIG. 19, the semiconductor device 300A illustrated in FIG. 14 incorporated into the semiconductor package is exemplified, which is, however, provided only for illustration. The semiconductor package may be configured by incorporating one or more of the semiconductor devices 300B, 300C and 300D shown in FIGS. 15 to 17.

In one embodiment, the circuit board 600 can include a printed circuit board (PCB) 610, first metal pads 611a and 611b, a second metal pad 612, a plurality of solder balls 613, a semiconductor chip 620 and an encapsulant 630. In one embodiment, the semiconductor chip 620 can be electrically connected to the PCB 610 and can be electrically connected to the first metal pads 611a and 611b and the second metal pad 612 using, for example, a redistribution layer (not shown). In one embodiment, the semiconductor chip 620 can be at least partially surrounded by the encapsulant 630 to be protected from external surroundings in a more secure manner. Throughholes 630a and 630b exposing the first metal pads 611a and 611b formed on the PCB 610 to the outside are formed in the encapsulant 630, and first solder balls 340a and 340b of the semiconductor device 300A can be electrically connected to the first metal pads 611a and 611b through the throughholes 630a and 630b. The second metal pad 612 can be formed under the PCB 610 and can be electrically connected to the plurality of solder balls 613 to be connected to an external device.

Figure 20:
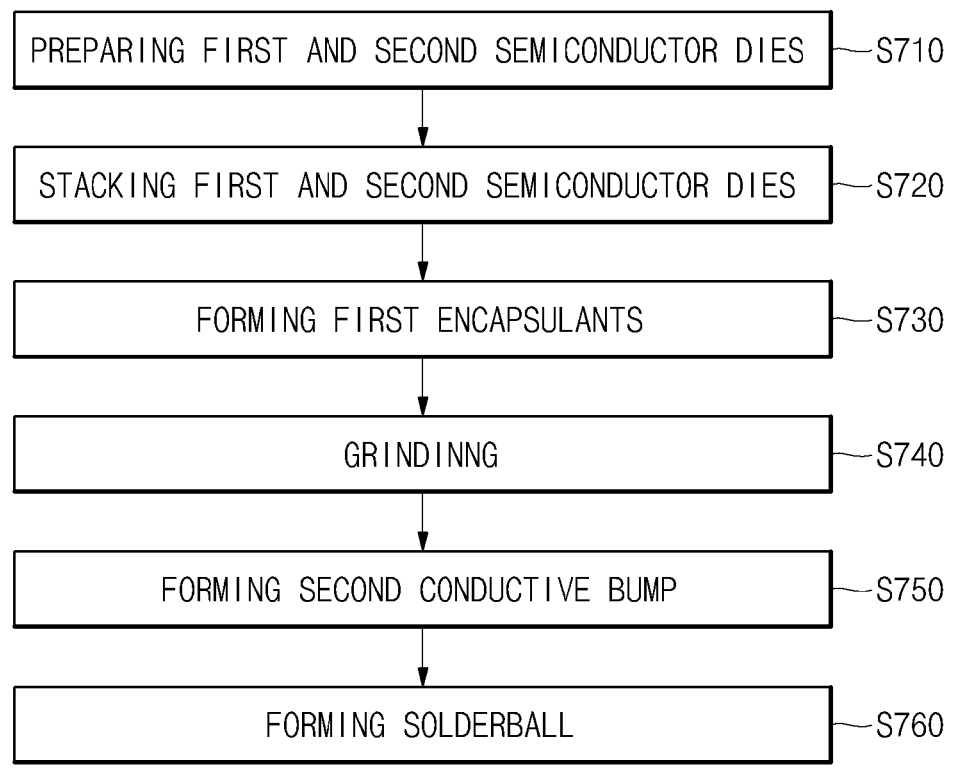
FIG. 20 is a flowchart illustrating a method of manufacturing a semiconductor device according to still another embodiment of the present invention.

FIG. 20 is a flowchart illustrating a method of manufacturing a semiconductor device (S700) according to another embodiment. In one embodiment, the method (S700) includes preparing first and second semiconductor dies (S710), stacking first and second semiconductor dies (S720), forming first encapsulants (S730), grinding or removing (S740), forming a second conductive bump (S750), and forming a solder ball (S760).

Figure 21:
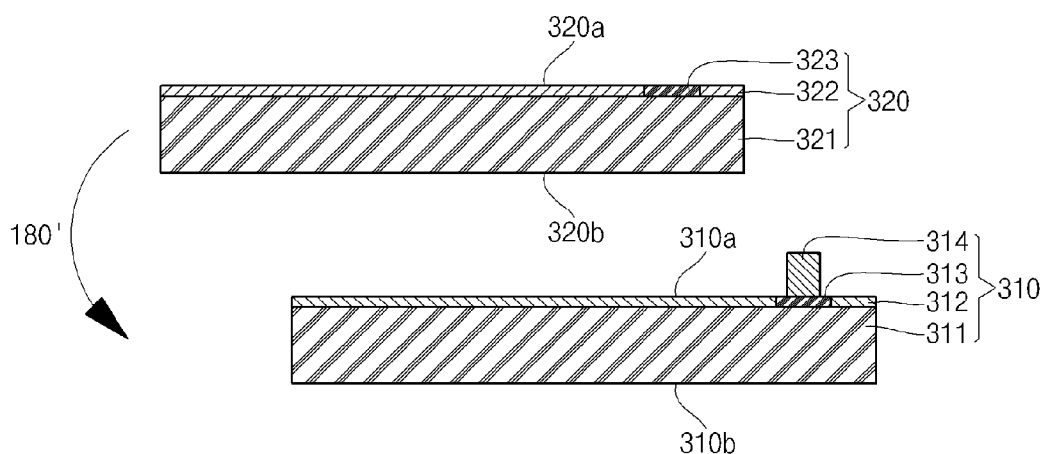
FIGS. 21 to 26 are views sequentially illustrating process steps in a method of manufacturing a semiconductor device according to still another embodiment of the present invention.

FIGS. 21 to 26 are views sequentially illustrating process steps in a method of manufacturing a semiconductor device in accordance with FIG. 20. In the preparing of the first and second semiconductor dies (S710), as illustrated in FIG. 21, a first semiconductor die 310 and a second semiconductor die 320 are prepared or provided, respectively.

In one embodiment, the first semiconductor die 310 can include an inactive region 311, an active region 312, a first bond pad 313 and a first conductive bump 314. In one embodiment, the inactive region 311 may be a general wafer. The active region 312 can be formed on the inactive region 311 and, in one embodiment, can include memory chips or memory devices. In one embodiment, the first bond pad 313 can include one or more conductive materials, such as copper, aluminum, gold, silver, and equivalents thereof, but aspects of the present embodiment are not limited thereto. The first conductive bump 314 can be connected to the first bond pad 313 and can upwardly protrude from the first bond pad 313 to a predetermined height. In one embodiment, the first conductive bump 314 can be copper or tin, but aspects of the present embodiment are not limited thereto.

In one embodiment, the first semiconductor die 310 has a first surface 310a and a second surface 310b opposite to each other. Here, the first surface 310a may be defined as a top surface of the first semiconductor die 310, that is, a top surface of the active region 312, and the second surface 310b may be defined as a bottom surface of the first semiconductor die 310, that is, a bottom surface of the inactive region 311.

In one embodiment, the second semiconductor die 320 can include an inactive region 321, an active region 322, a second bond pad 323 and a second conductive bump 324. In one embodiment, the inactive region 321 can be a general wafer. The active region 322 can be formed on the inactive region 321 and, in one embodiment, can include memory chips or memory devices. In one embodiment, the second bond pad 323 can be one or more conductive materials, such as copper, aluminum, gold, silver, and equivalents thereof, but aspects of the present embodiment are not limited thereto.

The second semiconductor die 320 may have a third surface 320a and a fourth surface 320b opposite to each other. As shown in FIG. 21, the third surface 320a may correspond to the top surface of the active region 322 formed in the second semiconductor die 320 and the fourth surface 320b may correspond to the bottom surface of the inactive region 321.

In one embodiment, the second semiconductor die 320 has a third surface 320a and a fourth surface 320b opposite to each other. As illustrated in FIG. 21, the third surface 320a may correspond to the top surface of the active region 322 formed in the second semiconductor die 320 and the fourth surface 320b may correspond to the bottom surface of the inactive region 321.

Figure 22:
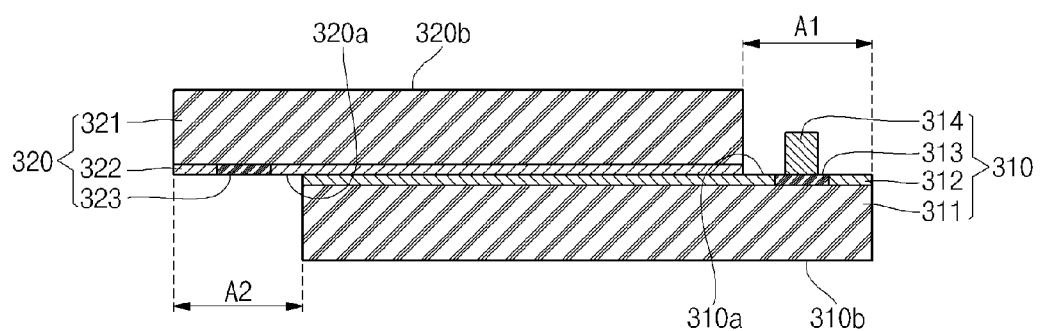

In the stacking of the first and second semiconductor dies (S720), as illustrated in FIG. 22, the second semiconductor die 320 can be stacked or disposed on the first semiconductor die 310. In one embodiment, the second semiconductor die 320 can be stacked on the first semiconductor die 310 such that the first surface 310a of the first semiconductor die 310 is brought into contact with the third surface 320a of the second semiconductor die 320. In addition, the first and second semiconductor dies 310 and 320 may not be stacked to completely overlap with each other but can be stacked to form non-overlapping regions A1 and A2 at opposite side portions of the first and second semiconductor dies 310 and 320, where the first and second bond pads 313 and 323 are formed. In one embodiment, the first conductive bump 314 of the first semiconductor die 310 can be positioned in the non-overlapping regions A1 and A2.

Figure 23:
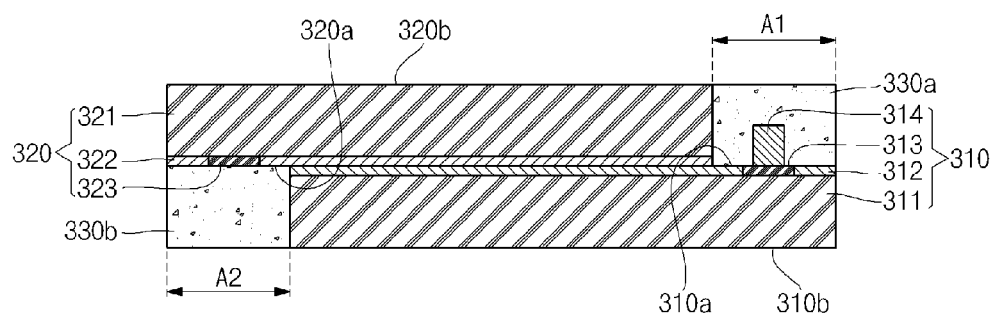
Figure 24:
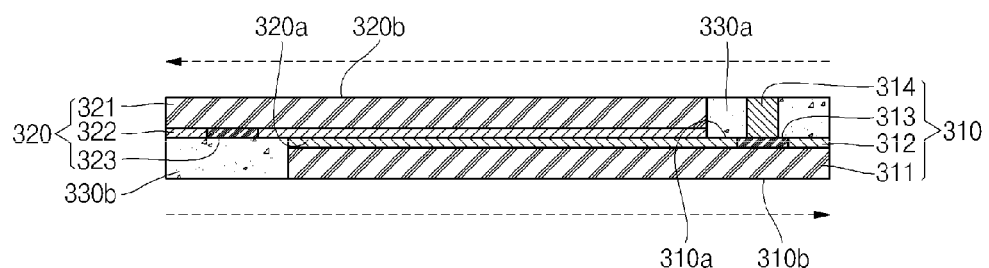

In the forming of the first encapsulants (S730), as illustrated in FIG. 23, first encapsulants 330a and 330b can be formed to fill the non-overlapping regions A1 and A2 of the first and second semiconductor dies 310 and 320 by molding. In one embodiment, the first encapsulants 330a and 330b can be configured to more tightly couple the first and second semiconductor dies 310 and 320 to each other. In particular, the first encapsulants 330a and 330b can more tightly affix the first conductive bump 314 to the first bond pad 313 in the non-overlapping region 330a of the first bond pad 313.

In the grinding (S740), as illustrated in 24, the grinding can be performed on the first encapsulant 330a and the fourth surface 320b of the second semiconductor die 320 to expose the first conductive bump 314 from the first encapsulant 330a to the outside. In addition, the second surface 310b of the first semiconductor die 310 and the first encapsulant 330b are subjected to grinding, thereby obtaining a thin profile of the semiconductor device.

Figure 25:
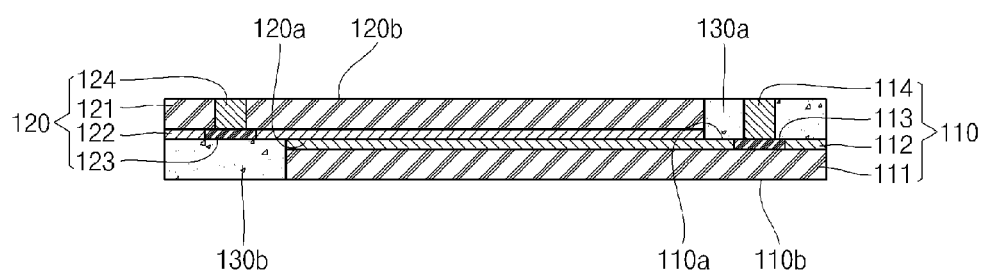

In the forming of the second conductive bump (S750), a via hole can formed in the inactive region 321 of the second semiconductor die 320 using a through silicon via (TVS) process and can be filled with a predetermined metal, thereby forming a second conductive bump 324 connected to a second bond pad 323, as illustrated in FIG. 25.

Figure 26:
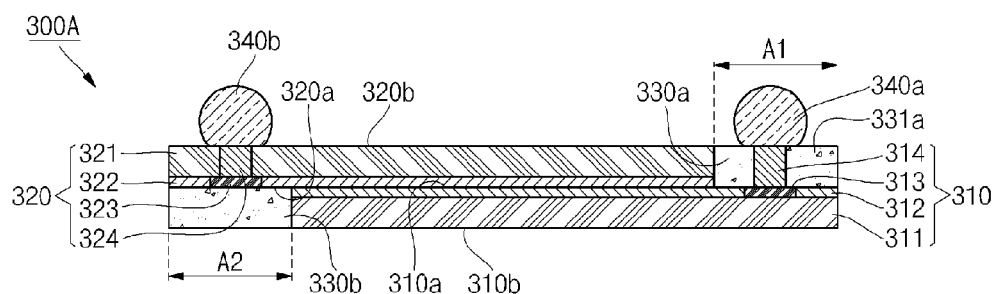

In the forming of the solder ball (S760), as illustrated in FIG. 26, a first solder ball 340a is connected to an upper portion of the first conductive bump 314 and a first solder ball 340b is connected to an upper portion of the second conductive bump 324 to provide, in one embodiment, the semiconductor device 300A.

Figure 27:
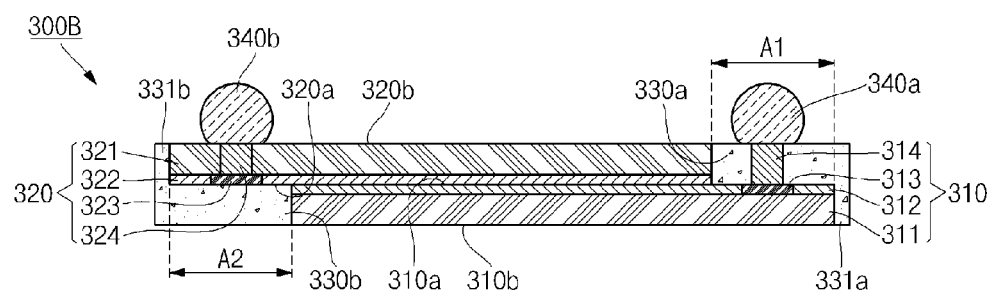
FIGS. 27 to 29 are sectional views illustrating methods of manufacturing semiconductor devices according to modified example embodiments of the present invention.
Figure 28:
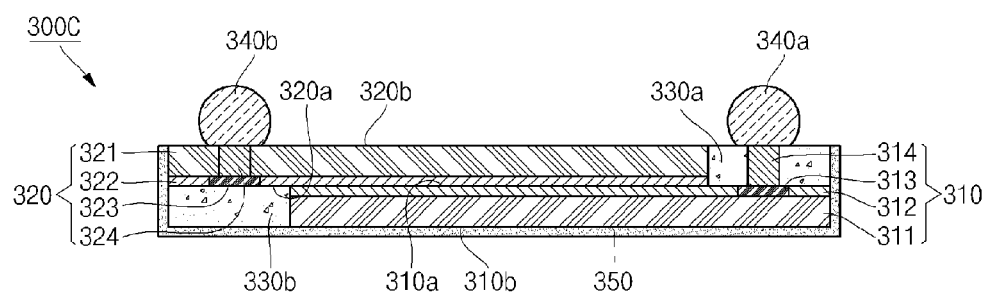
Figure 29:
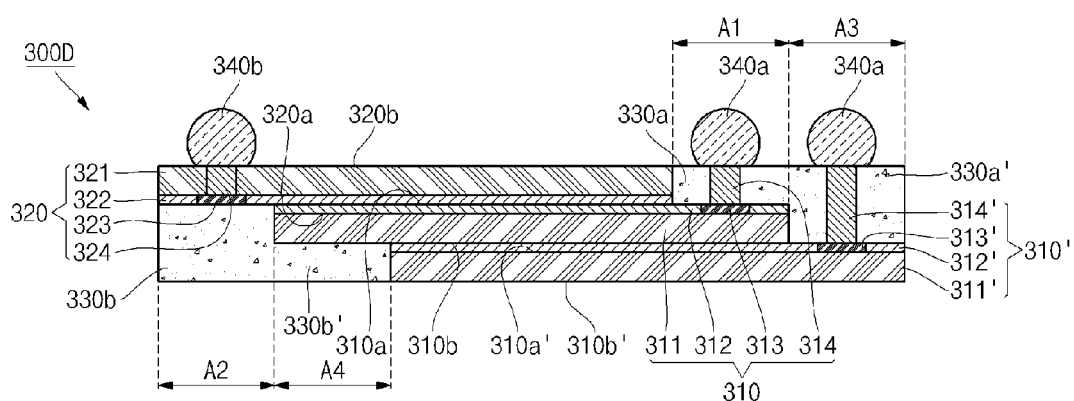

FIGS. 27 to 29 are sectional views illustrating methods of manufacturing semiconductor devices according to modified example embodiments.

First, the semiconductor device 300B illustrated in FIG. 27 is formed by further forming second encapsulants 331a and 331b on lateral surfaces of the semiconductor device 300A manufactured according to still another embodiment. In one embodiment, the second encapsulants 331a and 331b can be connected to first encapsulants 330a and 330b, respectively.

As described previously, compared with the semiconductor device 300A illustrated in FIG. 26, the semiconductor device 300B illustrated in FIG. 27 has molding regions, that is, encapsulant regions extending to lateral sides of the device. In one embodiment, the second encapsulants 331a and 331b can be formed by increasing a sawing width of the semiconductor device, instead of separately forming the first encapsulants 330a and 330b and the second encapsulants 331a and 331b. For example, in sawing the semiconductor device 300A illustrated in FIG. 26, not only the encapsulant regions but also the lateral sides of the first and second semiconductor dies 310 and 320 are subjected to sawing. In the semiconductor device 300B illustrated in FIG. 14, the second encapsulants 331a and 331b can be obtained by sawing only the encapsulant regions spaced a predetermined distance apart from the first and second semiconductor dies 310 and 320.

The semiconductor device 300C illustrated in FIG. 28 can be formed by further forming an insulation protecting layer or an electromagnetic interference (EMI) protecting layer surrounding lateral surfaces and bottom surface of the semiconductor device 300A illustrated in FIG. 26.

The semiconductor device 300D illustrated in FIG. 29 may be formed by further stacking three or more layers of semiconductor dies, and may include two or more first semiconductor dies 310 and 310'. For example, a first semiconductor die 310 may be stacked on an additional first semiconductor die 310' and a second semiconductor die 320 may be stacked on the first semiconductor die 310.

In one embodiment, the additional first semiconductor die 310' can have substantially the same configuration as the first semiconductor die 310 illustrated in FIG. 27. The additional first semiconductor die 310' can include an inactive region 311', an active region 312', an additional first bond pad 313' and an additional first conductive bump 314'. In one embodiment, the inactive region 311' can be a general wafer. The active region 312' can be formed on the inactive region 311' and, in one embodiment, can include memory chips or memory devices. The first bond pad 313' can include one or more conductive materials, such as copper, aluminum, gold, silver, and equivalents thereof, but aspects of the present embodiment are not limited thereto. The additional first conductive bump 314' can be connected to the additional first bond pad 313' and can upwardly protrude from the additional first bond pad 313' to a predetermined height. For example, the additional first conductive bump 314' can protrude from the additional first bond pad 313' to an imaginary horizontal line formed by the fourth surface 320b of the second semiconductor die 320. The additional first conductive bump 314' can include copper or tin, but aspects of the present invention are not limited thereto.

The additional first semiconductor die 310' can have an additional first surface 310a' and an additional second surface 310b' opposite to each other. Here, the additional first surface 310a' can be defined as a top surface of the additional first semiconductor die 310', that is, a top surface of the active region 312', and the additional second surface 310b' can be defined as a bottom surface of the additional first semiconductor die 310', that is, a bottom surface of the inactive region 311'. In one embodiment, there can be non-overlapping regions A3 and A4 formed between the first semiconductor die 310 and the additional first semiconductor die 310', and the first semiconductor die 310 and the additional first semiconductor die 310' can be stacked such that the second surface 310b of the first semiconductor die 310 is brought into contact with the additional first surface 310a of the additional first semiconductor die 310'. An additional second conductive bump 314' can be positioned on the non-overlapping region A3 of the additional first bond pad 313'.

Figure 30:
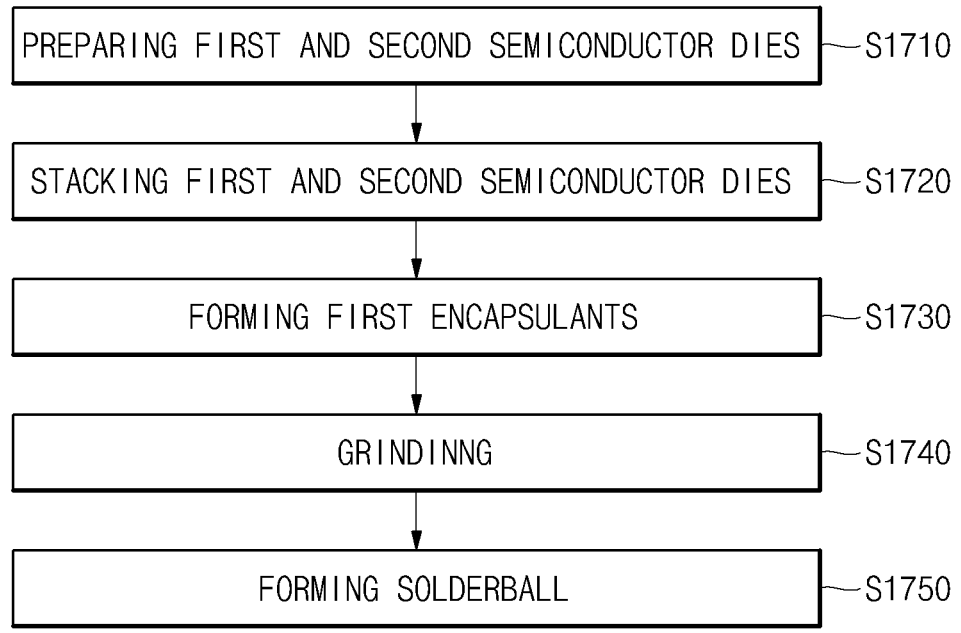
FIG. 30 is a flowchart illustrating a method of manufacturing a semiconductor device according to still another embodiment of the present invention.
Figure 31:
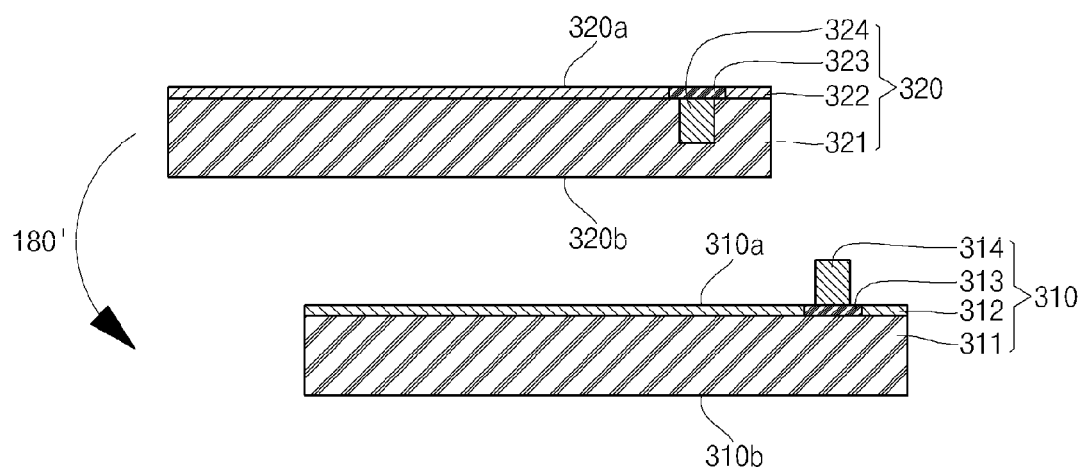
FIGS. 31 to 35 are sectional views sequentially illustrating process steps in the method of manufacturing a semiconductor device according to still another embodiment of the present invention.
Figure 32:
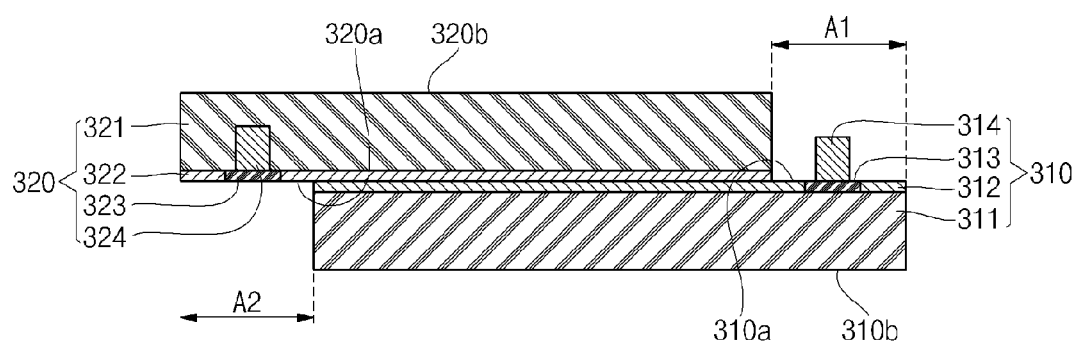
Figure 33:
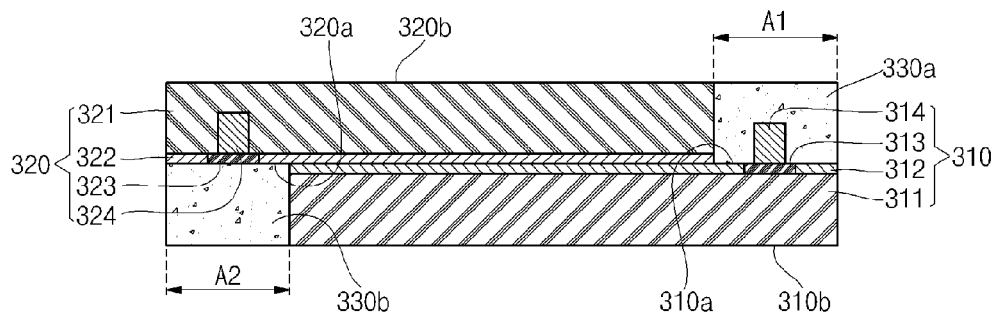

FIG. 30 is a flowchart illustrating a method of manufacturing a semiconductor device (S1700) according to a further embodiment, and FIGS. 31 to 35 are sectional views sequentially illustrating process steps in the method of FIG. 30. In one embodiment, the method (S1700) includes preparing first and second semiconductor dies (S1710), stacking first and second semiconductor dies (S1720), forming first encapsulants (S1730), grinding or removing (S1740), and forming a solder ball (S1750).

The method of manufacturing a semiconductor (S1700) is different from the method of manufacturing a semiconductor device (S700) in view of the preparing of the first and second semiconductor dies (S1710) and the grinding (S1740). Unlike in the preparing of the first and second semiconductor dies (S710) in the method of manufacturing a semiconductor device (S700), in the preparing of the first and second semiconductor dies (S1710) in the method of manufacturing a semiconductor device (S1700), a second semiconductor die 320 having a pre-formed second conductive bump 324 is prepared. In one embodiment, the second conductive bump 324 can be formed to have a predetermined depth in an inactive region 321 from a bottom surface of the second bond pad 323.

Figure 34:
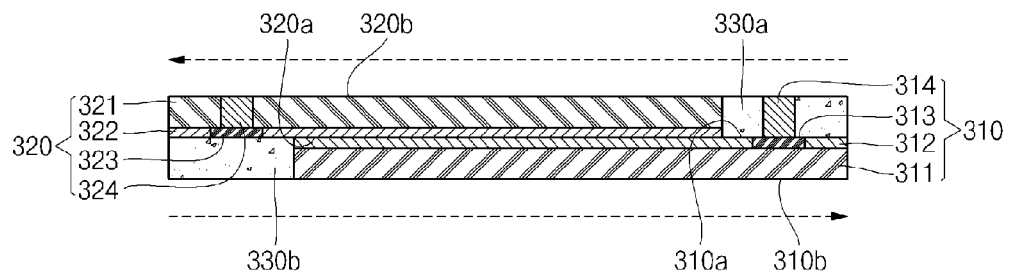
Figure 35:
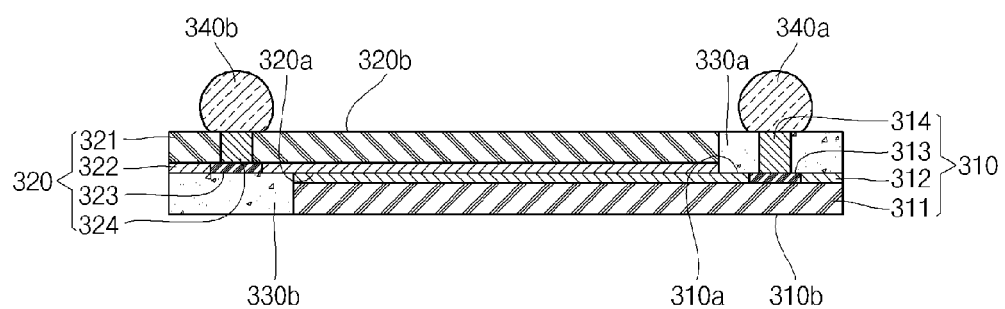

In addition, in the grinding (S1740) step, as illustrated in FIG. 34, in order to expose not only a first conductive bump 314 but also a second conductive bump 324 to the outside, a second surface 320b of the inactive region 321 formed in the second semiconductor die 320 and a first encapsulant 330a can be subjected to a grinding or removal step.

In addition, the stacking of the first and second semiconductor dies (S1720), the forming of the first encapsulants (S1730) and the forming of the solder ball (S1750) are substantially similar to the stacking of the first and second semiconductor dies (S720), the forming of the first encapsulants (S730) and the forming of the solder ball (S760), and detailed descriptions thereof will not be provided.

Figure 36:
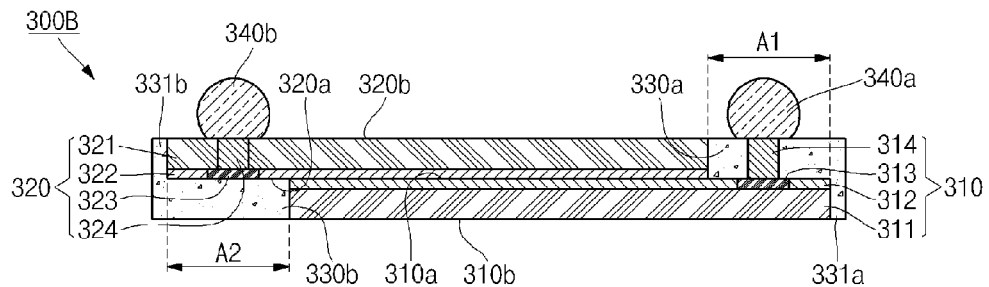
FIGS. 36 to 38 are sequential views illustrating methods of manufacturing semiconductor devices according to modified example embodiments of the present invention.
Figure 37:
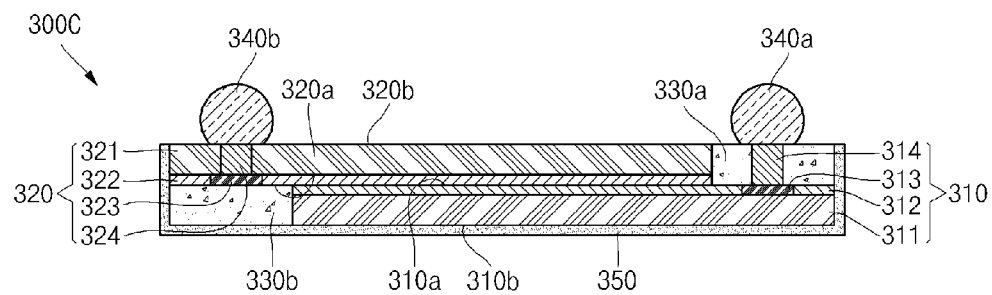
Figure 38:
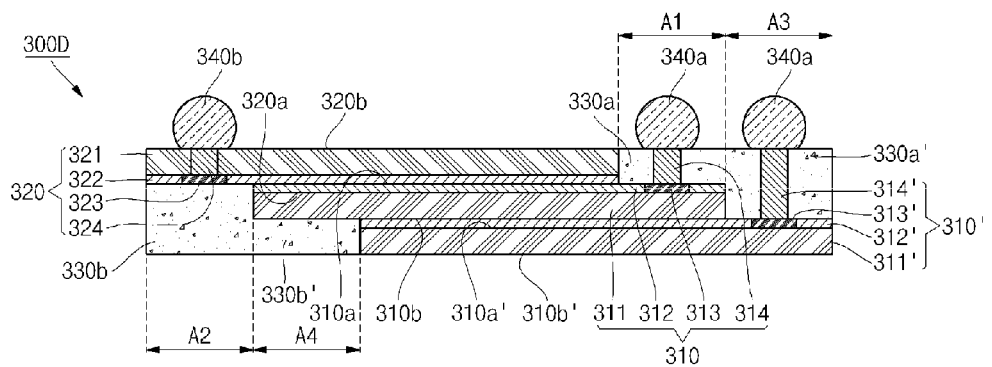

FIGS. 36 to 38 are sectional views illustrating methods of manufacturing semiconductor devices according to the modified example embodiments described previously. The methods of manufacturing semiconductor devices according to modified example embodiments illustrated in FIGS. 36 to 38 are modified examples of the manufacturing methods illustrated in FIGS. 27 to 29 used to provide the semiconductor device 300A, and detailed descriptions thereof will not be provided.

Figure 39:
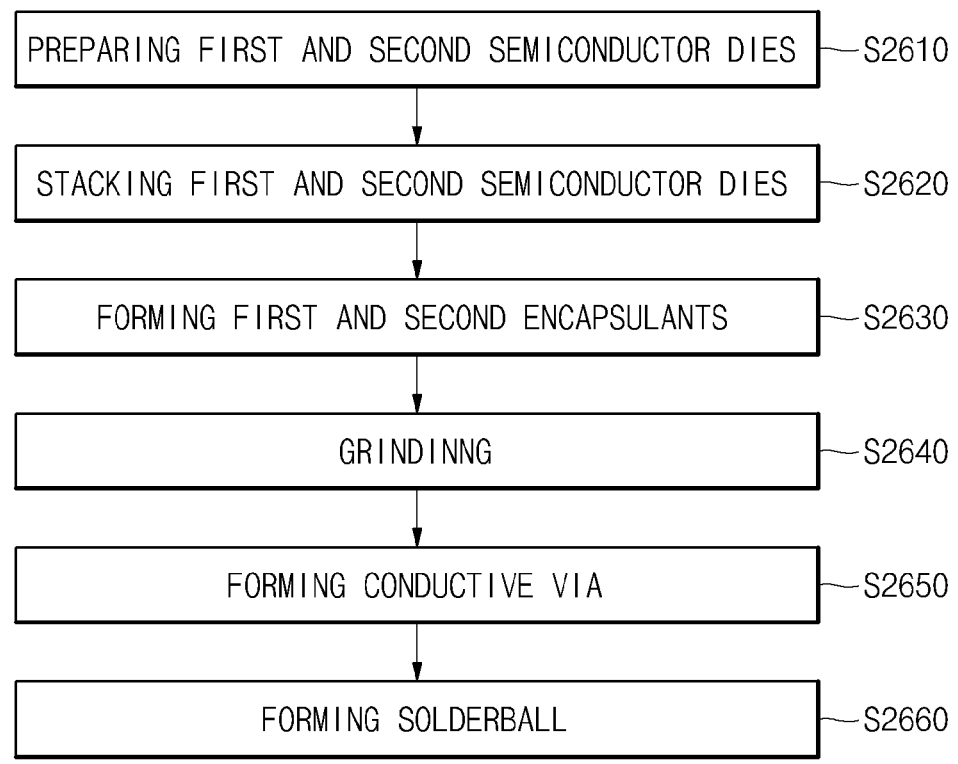
FIG. 39 is a flowchart illustrating a method of manufacturing a semiconductor device according to still another embodiment of the present invention.

FIG. 39 is a flowchart illustrating a method of manufacturing a semiconductor device (S2600) according to a still further embodiment. In one embodiment, the method of manufacturing a semiconductor device (S2600) includes preparing or providing first and second semiconductor dies (S2610), stacking first and second semiconductor dies (S2620), forming first and second encapsulants (S2640), forming a redistribution layer (S2650), forming a conductive via (S2660), and forming a solder ball (S2670).

Figure 40:
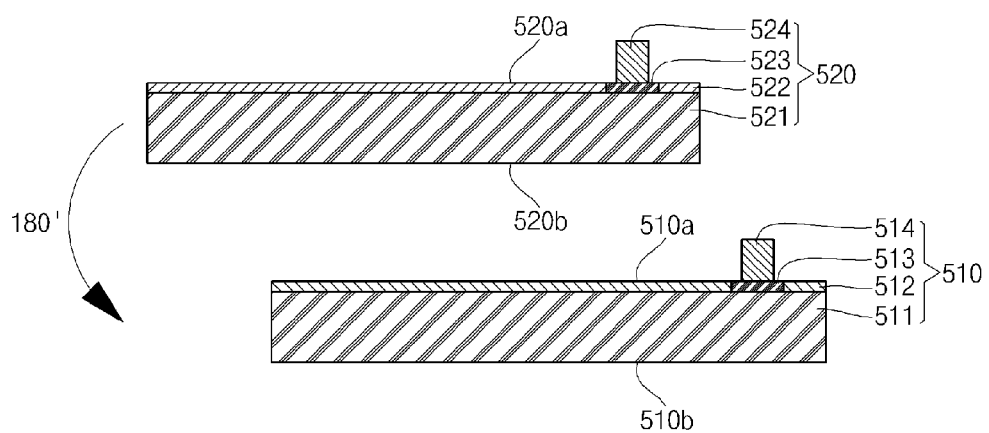
FIGS. 40 to 46 are sequential views sequentially illustrating process steps in the method of manufacturing a semiconductor device according to still another embodiment of the present invention.
Figure 41:
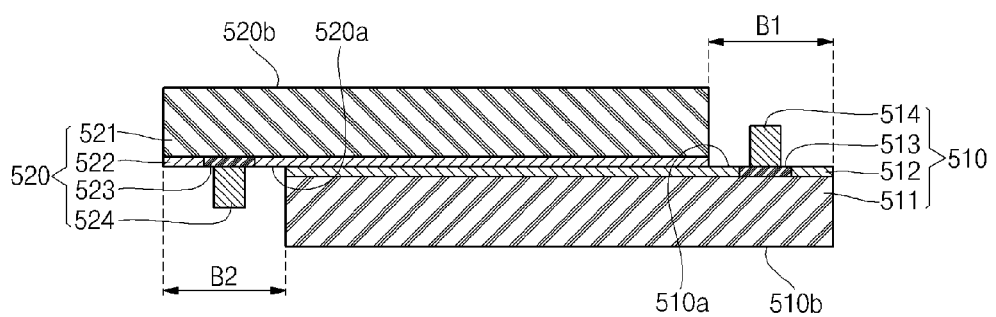

FIGS. 40 to 46 are views sequentially illustrating process steps in the method of manufacturing a semiconductor device according to FIG. 39. In the preparing or providing of the first and second semiconductor dies (S2610), as illustrated in FIG. 40, a first semiconductor die 510 and a second semiconductor die 520 are prepared, respectively.

In one embodiment, the first semiconductor die 510 can include an inactive region 511, an active region 512, a first bond pad 513 and a first conductive bump 514. In one embodiment, the inactive region 511 can be a general wafer. The active region 512 can be formed on the inactive region 511 and, in one embodiment, can include memory chips or memory devices. In one embodiment, the first bond pad 513 can include one or more conductive materials, such as copper, aluminum, gold, silver, and equivalents thereof, but aspects of the present embodiment are not limited thereto. The first conductive bump 514 can be connected to the first bond pad 513 and can upwardly protrude from the first bond pad 513 to a predetermined height. The first conductive bump 514 can include copper or tin, but aspects of the present embodiment are not limited thereto.

In one embodiment, the first semiconductor die 510 has a first surface 510a and a second surface 510b opposite to each other. In one embodiment, the first surface 510a can be defined as a top surface of the first semiconductor die 510, that is, a top surface of the active region 512, and the second surface 510b can be defined as a bottom surface of the first semiconductor die 510, that is, a bottom surface of the inactive region 511.

In one embodiment, the second semiconductor die 520 can include an inactive region 521, an active region 522, a second bond pad 523 and a second conductive bump 524. In one embodiment, the inactive region 521 can be a general wafer. The active region 522 can be formed on the inactive region 521 and, in one embodiment, can include memory chips or memory device. The second bond pad 523 can be one or more conductive materials, such as copper, aluminum, gold, silver, and equivalents thereof, but aspects of the present embodiment are not limited thereto. The second conductive bump 524 can be connected to the second bond pad 523 and can upwardly protrude from the second bond pad 523. The second conductive bump 524 can include copper or tin, but aspects of the present embodiment are not limited thereto.

In one embodiment, the second semiconductor die 520 has a third surface 520a and a fourth surface 520b opposite to each other. In one embodiment, the third surface 520a can correspond to the top surface of the active region 522 formed in the second semiconductor die 520 and the fourth surface 520b can correspond to the bottom surface of the inactive region 521.

In the stacking of the first and second semiconductor dies (S2620), the second semiconductor die 520 can be stacked on the first semiconductor die 510. In one embodiment, the second semiconductor die 520 can be turned over by being rotating 180 degrees to then be stacked onto the first semiconductor die 510. Accordingly, the first and second semiconductor dies 510 and 520 can be stacked such that the first surface 510a of the first semiconductor die 510 and the third surface 520a of the second semiconductor die 520 are brought into contact with each other.

In one embodiment, the first and second semiconductor dies 510 and 520 are not stacked to completely overlap with each other but can be stacked to form non-overlapping regions B1 and B2 at opposite side portions of the first and second semiconductor dies 510 and 520, where the first and second bond pads 513 and 523 are formed. In one embodiment, the first conductive bump 514 of the first semiconductor die 510 and the second conductive bump 524 of the second semiconductor die 520 can be positioned in the non-overlapping regions B1 and B2, respectively.

Figure 42:
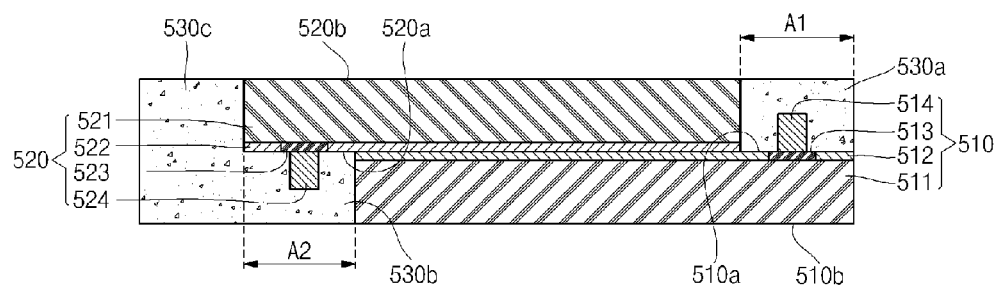

In the forming of the first and second encapsulants (S2630), as illustrated in FIG. 42, first encapsulants 530a and 530b and a second encapsulant 530c can be formed together.

In one embodiment, the first encapsulants 530a and 530b can be formed to fill the non-overlapping regions B1 and B2 of the first and second semiconductor dies 510 and 520 by molding. The first encapsulants 530a and 530b can function to more tightly couple the first and second semiconductor dies 510 and 520 to each other. In particular, the first encapsulants 530a and 530b can more tightly affix the first and second conductive bumps 514 and 524 to the first and second bond pads 513 and 523 in the non-overlapping regions 530a and 530b.

In one embodiment, the second encapsulant 530c can be formed on lateral surfaces of the first and second semiconductor dies 510 and 520 to be connected to the first encapsulant 530b. For example, the second encapsulant 530c can be formed to be connected to the first encapsulant 530b formed on the non-overlapping region B2 of the second conductive bump 524. Since the first conductive bump 514 and the second conductive bump 524 protrude in different directions, electric paths of the first conductive bump 514 and the second conductive bump 524 should conform to each other. When the electrical path of the second conductive bump 524 is changed, as shown in FIG. 42, the second encapsulant 530c is preferably connected to the first encapsulant 530b of the second conductive bump 524.

Figure 43:
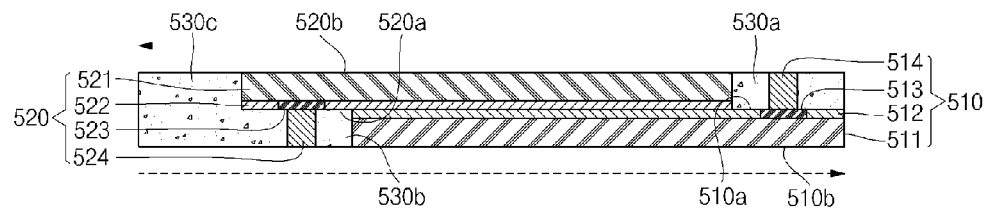

In the grinding (S2640), as illustrated in FIG. 43, in order to expose a first conductive bump 514 and a second conductive bump 524 to the outside, a second surface 510b of the first semiconductor die 510, a fourth surface 520b of the second semiconductor die 520, the first encapsulants 530a and 530b and the second encapsulant 530c can be subjected to grinding or a material removal process.

Figure 44:
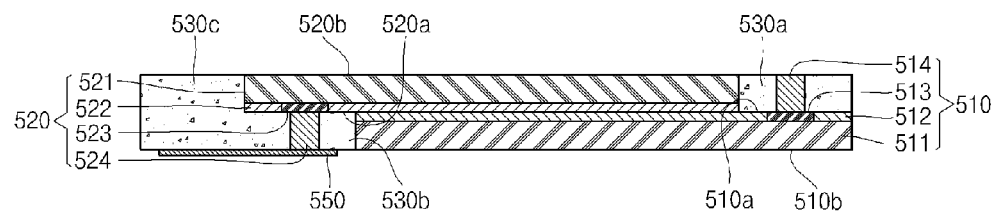

In the forming of the redistribution layer (S2650), as illustrated in FIG. 44, a redistribution layer 550 can be formed on surfaces of the first encapsulant 530b and the second encapsulant 530c in the second conductive bump 524 and configured to be electrically connected to the second conductive bump 524.

Figure 45:
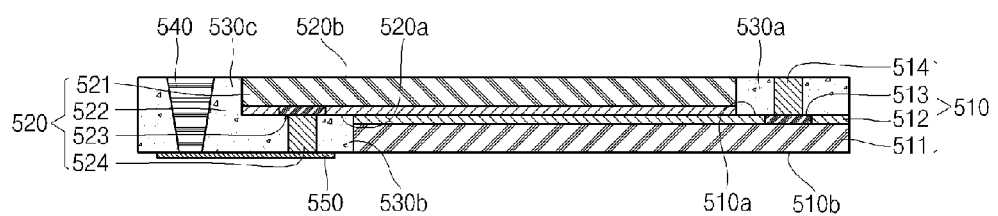

In the forming of the conductive via (S2660), as illustrated in FIG. 45, a conductive via 540 can be formed to penetrate from a top surface to a bottom surface of the second encapsulant 530c. In one embodiment, the top surface of the second encapsulant 530c can be substantially coplanar with the fourth surface 520b of the second semiconductor die 520 and the bottom surface of the second encapsulant 530c can be substantially coplanar with the second surface 510b of the first semiconductor die 510. The conductive via 540 can include one or more metal materials, but aspects of the present embodiment are not limited thereto.

Figure 46:
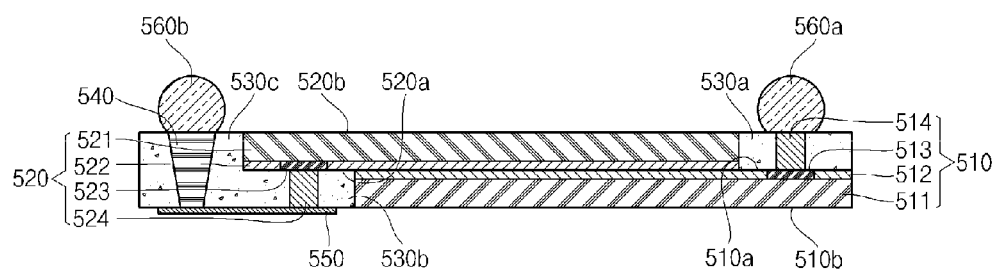
Figure 47:
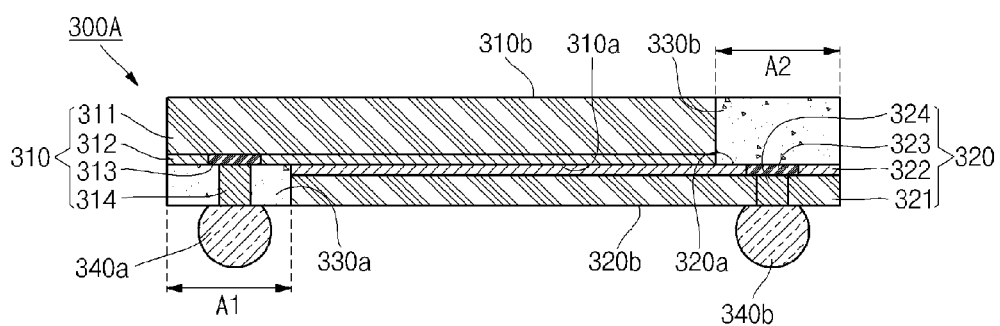
FIGS. 47 to 51 are sectional views illustrating a method of manufacturing a semiconductor device according to still another embodiment of the present invention.

In the forming of the solder ball (S2670), as illustrated in FIG. 46, a first solder ball 560a can be connected to an upper portion of the first conductive bump 514 and a second solder ball 560b can be connected to an upper portion of the second conductive bump 524.

FIGS. 47 to 51 are sectional views illustrating a method of manufacturing a semiconductor device according to another embodiment. In the semiconductor package manufacturing method illustrated in FIGS. 47 to 51, the semiconductor device 300A is used by way of example, and the semiconductor package can be manufactured by using any or all of the semiconductor devices described previously.

Figure 48:
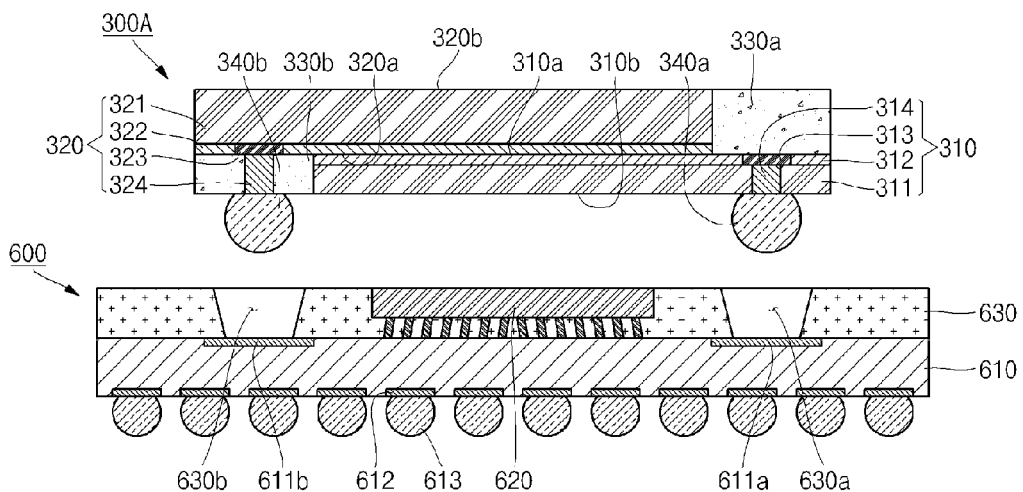
Figure 49:
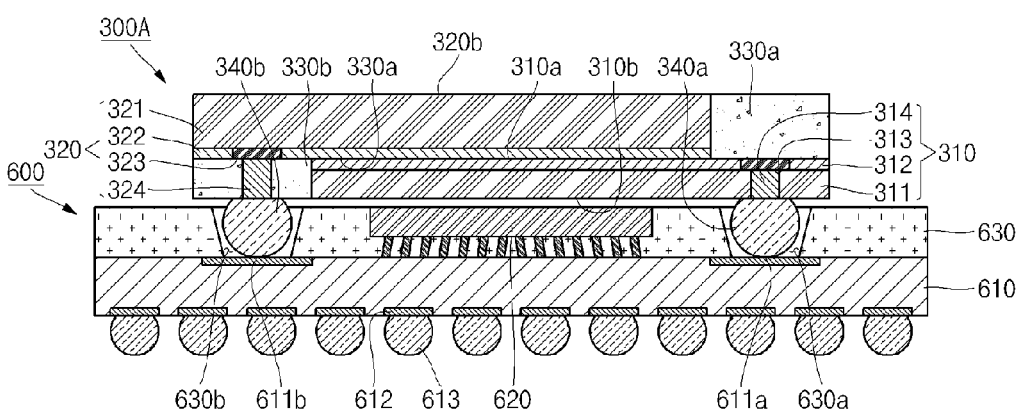
Figure 50:
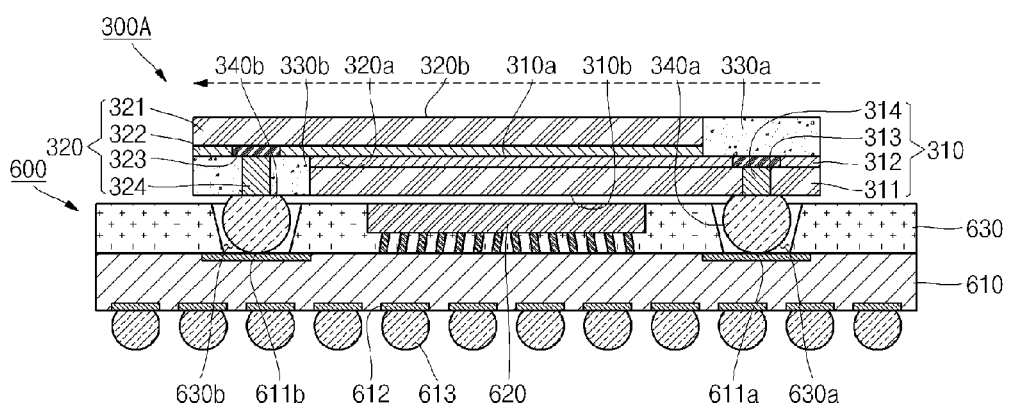
Figure 51:
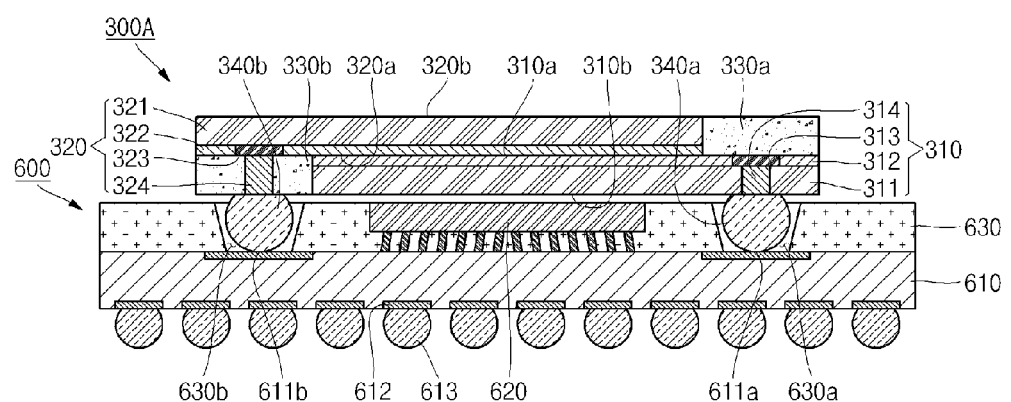

First, as illustrated in FIGS. 48 and 49, first solder balls 340a and 340b of the semiconductor device 300A can be electrically connected to first metal pads 611a and 611b of a circuit board 600. Then, a top surface of the semiconductor device 300A, that is, a fourth surface 320b of a second semiconductor die 320 and a first encapsulant 330a adjacent to the fourth surface 320b can be subjected to grinding or a removal process as illustrated in FIG. 50. This is for the purpose of reducing the overall thickness of a semiconductor die by grinding the semiconductor die in order to achieve a slim semiconductor package as illustrated in FIG. 51 according to the specification requirement of the semiconductor package.

Those skilled in the art will appreciate that according to another embodiment, a method for forming a semiconductor package includes providing a first semiconductor die (for example, element 110, 210, 310, 310') having a first surface (for example, element 110a, 210a, 310a, 310a') having an exposed conductive pad (for example, element 111, 211, 313, 313'). The method includes providing a second semiconductor die (120, 220, 320, 320') having a first surface (for example, element 120a, 220a, 320a, 320a') having an exposed conductive pad (for example, element 121, 221, 323). The method includes attaching the first surface of the first semiconductor die to the first surface of the second semiconductor so that the first semiconductor die and the second semiconductor die are laterally offset to provide non-overlapping regions (for example, elements A1, A2, A3, A4, B1, B2) configured to expose the conductive pads. The method includes forming an encapsulant encapsulating the first semiconductor die and the second semiconductor die. The method includes forming conductive structures (for example, element 41, 42, 314, 314', 324) electrically coupled to the conductive pads.

In another embodiment, the method can include attaching solder structures (for example, element 50, 340a, 340b) to the conductive structures. In a further embodiment, the method can include forming the conductive structures before forming the encapsulant. In a still further embodiment, the method can include forming the conductive structures after forming the encapsulant. In another embodiment, the method can include forming one of conductive structure (for example, element 33, 41, 42) passing through the encapsulant and spaced apart from the first and second semiconductor die. In a further embodiment, forming the encapsulant can include forming the encapsulant along side surfaces of the first and second semiconductor dies (for example, element 331a, 331b). In a still further embodiment, the method can include placing the first semiconductor die on a carrier (for example, element 10) and removing the carrier after forming the encapsulant. In another embodiment, the method can include removing portions of the encapsulant (for example, element S740, S1740, S2640). In a further embodiment, the method can include forming a protective layer (for example, element 350) on one or more surfaces of the encapsulant. In a still further embodiment, the method can include attaching a third semiconductor die (for example, element 130) to the semiconductor package. In another embodiment, the method can include providing a second semiconductor package having throughholes (for example, element 630a, 630b) and attaching the semiconductor package to the second semiconductor package using the throughholes. In a further embodiment, the method includes forming the semiconductor package absent a printed circuit board.

While the subject matter of the invention is described with specific preferred embodiments and example embodiments, the foregoing drawings and descriptions thereof depict only typical embodiments of the subject matter and are not therefore to be considered limiting of its scope. It is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments, as would be understood by those skilled in the art.

What is claimed is:

1. A semiconductor package comprising:
   a first semiconductor die having a first surface facing upwardly to expose a bond pad, and a second surface opposed to the first surface;
   a second semiconductor die having a first surface facing downwardly to expose a bond pad and disposed to be offset with respect to the first surface of the first semiconductor die;
   an encapsulant encapsulating the first semiconductor die and the second semiconductor die together, wherein the second surface of the first semiconductor die is exposed to the outside on a first side of the semiconductor package;
   throughholes disposed in the encapsulant adjacent the bond pad of the first semiconductor die and adjacent the bond pad of the second semiconductor die;
   a first conductive layer disposed along an inner surface of each throughhole;
   a second conductive layer adjacent the first conductive layer within each throughhole; and
   a first solder structure directly attached to the throughhole adjacent the bond pad of the second semiconductor die on the first side of the semiconductor package without an intervening substrate.

2. The semiconductor package of claim 1, wherein the throughholes include a first throughhole disposed to extend upwardly from the bond pad of the first semiconductor die, a second throughhole disposed to extend downwardly from the bond pad of the second semiconductor die, and a third throughhole disposed to pass through the encapsulant from its top and bottom surfaces at a position adjacent to the bond pad of the first semiconductor die, the semiconductor package further comprising a second solder structure directly attached to the third throughhole on the first side of the semiconductor package.

3. The semiconductor package of claim 2, wherein the first conductive layer of the first throughhole is electrically connected to the bond pad of the first semiconductor die and the first conductive layer of the second throughhole is electrically connected to the bond pad of the second semiconductor die.

4. The semiconductor package of claim 3, wherein the first conductive layer of the first throughhole is electrically connected to the first conductive layer of the third throughhole.

5. The semiconductor package of claim 1, wherein the second semiconductor die is attached to the first semiconductor die with an adhesive layer.

6. The semiconductor package of claim 3, further comprising a third semiconductor die stacked on the encapsulant and connected to the second conductive layer.

7. The semiconductor package of claim 3, wherein a second surface of the second semiconductor die is exposed through the encapsulant, and wherein the semiconductor package further comprises a protective film covering at least a top surface of the encapsulant and overlapping and contacting the second surface of the second semiconductor die.

8. A semiconductor package comprising:
   a first semiconductor die having a first surface facing upwardly to expose a bond pad, and a second surface opposite to the first surface of the first semiconductor die;
   a second semiconductor die having a first surface facing downwardly to expose a bond pad and disposed to be offset with respect to the first surface of the first semiconductor die; and
   an encapsulant encapsulating at least portions of the first semiconductor die and the second semiconductor die, wherein at least a portion of the second surface of the first semiconductor die is exposed to the outside of the semiconductor package, and
   wherein throughholes are disposed in the encapsulant adjacent the bond pad of the first semiconductor die and adjacent the bond pad of the second semiconductor die, and wherein the throughholes comprise:
      a first throughhole disposed in the encapsulant upwardly from the bond pad of the first semiconductor die;
      a second throughhole disposed in the encapsulant downwardly from the bond pad of the second semiconductor die; and
      a third throughhole disposed to pass through the encapsulant from its top and bottom surfaces at a position adjacent to the bond pad of the first semiconductor die;
   conductive structures disposed within the first, second and third throughholes; and
   solder structures directly attached to the second and third throughholes without an intervening insulated interconnect structure.

9. The semiconductor package of claim 8, wherein the solder structures comprise solder balls.

10. The semiconductor package of claim 8, wherein the conductive structures comprise:
    a first conductive layer; and
    a second conductive layer disposed adjacent the first conductive layer.

11. The semiconductor package of claim 8, wherein the conductive structures comprise a titanium liner and a copper fill material.

12. The semiconductor package of claim 8, wherein the second semiconductor die is attached to the first semiconductor die with an adhesive layer.

13. The semiconductor package of claim 12 further comprising a third semiconductor die attached to the first throughhole and the third through hole on a second side of the semiconductor package opposite to the first side of the semiconductor package.

14. The semiconductor package of claim 8, wherein a second surface of the second semiconductor die is exposed in the encapsulant to the outside of the semiconductor package.

15. The semiconductor package of claim 8, wherein the first throughhole is in electrical communication with the third throughhole but not the second throughhole.

16. A semiconductor package comprising:
    a first semiconductor die having a first surface and a first bond pad and a second surface opposite to the first surface;
    a second semiconductor die having a first surface and a second bond pad, wherein the first surface of the first semiconductor die and the first surface of the second semiconductor die are laterally offset to expose the first bond pad and the second bond pad;
    an encapsulant encapsulating at least portions of the first semiconductor die and the second semiconductor die, wherein the second surface of the first semiconductor die is exposed to the outside on a first side of the semiconductor package;
    a first throughhole disposed in the encapsulant and extending away from the first bond pad in a first direction;
    a second throughhole disposed in the encapsulant and extending away from the second bond pad in a second direction opposite to the first direction;
    a third throughhole disposed to pass through the encapsulant from its top and bottom surfaces at a position adjacent to the first bond pad;
    first conductive structures disposed within the first, second, and third throughholes; and
    solder structures directly attached to the second throughhole and third throughhole on the first side of the semiconductor package absent an intervening substrate.

17. The semiconductor package of claim 16, wherein the first conductive structures comprise:
    a first conductive layer; and
    a second conductive layer disposed adjacent the first conductive layer.

18. The semiconductor package of claim 16, wherein the second semiconductor die is attached to the first semiconductor die with an adhesive layer.

19. The semiconductor package of claim 16 further comprising a third semiconductor die electrically coupled to the first throughhole and the third throughhole on a second side of the semiconductor package opposite to the first side of the semiconductor package, wherein the third semiconductor die is attached to the semiconductor package with solder structures.

20. The semiconductor package of claim 16, wherein the first throughhole is in electrical communication with the third throughhole but not the second throughhole.

* * * * *